(12) United States Patent
David et al.

(10) Patent No.: US 10,096,755 B2
(45) Date of Patent: *Oct. 9, 2018

(54) LIGHT EMITTING DIODE WITH LOW REFRACTIVE INDEX MATERIAL LAYERS TO REDUCE LIGHT GUIDING EFFECTS

(71) Applicant: SORAA, INC., Fremont, CA (US)

(72) Inventors: Aurelien J. F. David, San Francisco, CA (US); Michael J. Grundmann, Santa Barbara, CA (US)

(73) Assignee: Soraa, Inc., Fremont, CA (US)

( * ) Notice: Subject to any disclaimer, the term of this patent is extended or adjusted under 35 U.S.C. 154(b) by 8 days.

This patent is subject to a terminal disclaimer.

(21) Appl. No.: 15/051,326

(22) Filed: Feb. 23, 2016

(65) Prior Publication Data

US 2016/0172556 A1 Jun. 16, 2016

Related U.S. Application Data

(63) Continuation of application No. 13/787,582, filed on Mar. 6, 2013, now Pat. No. 9,269,876.

(Continued)

(51) Int. Cl.
*H01L 33/00* (2010.01)
*H01L 33/30* (2010.01)
(Continued)

(52) U.S. Cl.
CPC .......... *H01L 33/58* (2013.01); *H01L 33/0075* (2013.01); *H01L 33/02* (2013.01);
(Continued)

(58) Field of Classification Search
CPC ............ G02B 19/0028; C09K 11/0883; H01L 33/0029; H01L 33/04; H01L 33/06;
(Continued)

(56) References Cited

U.S. PATENT DOCUMENTS 3,691,476 A * 9/1972 Hayashi .............. H01L 33/0025
  148/DIG. 107
4,328,469 A * 5/1982 Scifres ..................... H01S 5/20
  372/45.01

(Continued)

FOREIGN PATENT DOCUMENTS

CN 1567606 1/2005
CN 1698215 11/2005
(Continued)

OTHER PUBLICATIONS

Communication pursuant to Article 94(3) EPC dated Mar. 2, 2018 in European Application No. 13 757 051.1 (8 pages).

*Primary Examiner* — Maliheh Malek
(74) *Attorney, Agent, or Firm* — FisherBroyles, LLP

(57) ABSTRACT

A light-emitting diode (LED) for emitting emitted light having a particular wavelength, said LED comprising: (a) at least one n-doped layer; (b) at least one p-doped layer; (c) an active region comprising at least one layer of light-emitting material disposed between said at least one n-doped layer and said at least one p-doped layer, said active region having an average refractive index, calculated by averaging the LED's refractive index across the thickness of the active region; and (d) at least one low refractive index layer disposed within said particular wavelength of said active region, said at least one low refractive index layer having a refractive index below said average refractive index and a thickness sufficient to limit light being emitted into a guided mode of said active region to no more than 10% of said emitted light.

20 Claims, 24 Drawing Sheets

Related U.S. Application Data

(60) Provisional application No. 61/607,188, filed on Mar. 6, 2012.

(51) Int. Cl.
*H01L 33/04* (2010.01)
*H01L 33/58* (2010.01)
*H01L 33/02* (2010.01)
*H01L 33/32* (2010.01)
*H01L 33/10* (2010.01)

(52) U.S. Cl.
CPC .............. *H01L 33/04* (2013.01); *H01L 33/32* (2013.01); *H01L 33/10* (2013.01)

(58) Field of Classification Search
CPC ... H01L 33/30; H01L 33/305; H01L 33/0062; H01L 33/0075
See application file for complete search history.

(56) References Cited

U.S. PATENT DOCUMENTS

| | | | |
|---|---|---|---|
| 5,115,442 A * | 5/1992 | Lee | H01L 33/0062 372/45.01 |
| 5,237,581 A * | 8/1993 | Asada | H01L 33/105 257/98 |
| 5,331,654 A * | 7/1994 | Jewell | H01S 5/18355 372/18 |
| 5,351,256 A * | 9/1994 | Schneider | B82Y 20/00 372/45.011 |
| 5,778,018 A * | 7/1998 | Yoshikawa | H01S 5/18355 372/45.01 |
| 5,813,753 A * | 9/1998 | Vriens | H01L 33/502 257/13 |
| 5,832,017 A * | 11/1998 | Ramdani | B82Y 20/00 372/45.01 |
| 5,940,422 A * | 8/1999 | Johnson | H01S 5/18391 372/45.01 |
| 7,067,838 B1 | 6/2006 | Sato et al. | |
| 7,329,905 B2 | 2/2008 | Ibbetson et al. | |
| 7,723,731 B2 | 5/2010 | Konno et al. | |
| 7,858,408 B2 * | 12/2010 | Mueller | B29C 41/14 257/E21.504 |
| 8,299,473 B1 * | 10/2012 | D'Evelyn | H01L 33/44 257/79 |
| 8,431,945 B2 | 4/2013 | Choi et al. | |
| 8,476,644 B2 * | 7/2013 | Illek | H01L 33/382 257/79 |
| 9,000,466 B1 * | 4/2015 | Aldaz | H01L 33/58 257/94 |
| 9,831,388 B2 * | 11/2017 | Cich | H01L 33/32 |
| 2002/0106160 A1 * | 8/2002 | Cox | H01S 5/18355 385/49 |
| 2004/0135136 A1 * | 7/2004 | Takahashi | B82Y 20/00 257/14 |
| 2005/0024744 A1 * | 2/2005 | Falicoff | G02B 3/04 359/737 |
| 2005/0194896 A1 * | 9/2005 | Sugita | B82Y 20/00 313/506 |
| 2005/0225988 A1 * | 10/2005 | Chaves | G02B 3/06 362/332 |
| 2005/0231106 A1 * | 10/2005 | Tanaka | H01L 51/5275 313/506 |
| 2006/0105485 A1 * | 5/2006 | Basin | H01L 24/97 438/27 |
| 2006/0153511 A1 * | 7/2006 | Franklin | G02B 6/0001 385/123 |
| 2006/0192217 A1 * | 8/2006 | David | H01L 33/20 257/94 |
| 2006/0193359 A1 * | 8/2006 | Kuramoto | B82Y 20/00 372/45.01 |
| 2006/0226759 A1 * | 10/2006 | Masuda | C09K 11/0883 313/486 |
| 2006/0255341 A1 * | 11/2006 | Pinnington | B82Y 20/00 257/79 |
| 2007/0085100 A1 * | 4/2007 | Diana | B82Y 20/00 257/98 |
| 2007/0290191 A1 * | 12/2007 | Shuchukin | H01L 33/105 257/14 |
| 2008/0049329 A1 * | 2/2008 | Takeuchi | B82Y 20/00 359/589 |
| 2008/0093593 A1 | 4/2008 | Ryu | |
| 2009/0129417 A1 * | 5/2009 | Maeda | H01S 5/18355 372/44.01 |
| 2009/0146170 A1 * | 6/2009 | Zhong | H01L 33/22 257/98 |
| 2009/0161045 A1 * | 6/2009 | Kawamoto | G02B 5/3033 349/98 |
| 2009/0206354 A1 * | 8/2009 | Kitano | H01L 33/387 257/98 |
| 2009/0278233 A1 * | 11/2009 | Pinnington | H01L 21/02389 257/615 |
| 2009/0315048 A1 * | 12/2009 | Fehrer | H01L 33/20 257/98 |
| 2010/0127236 A1 * | 5/2010 | Bour | B82Y 20/00 257/13 |
| 2010/0226399 A1 * | 9/2010 | Nishinaka | H05B 33/0818 372/38.04 |
| 2010/0226402 A1 * | 9/2010 | Maeda | H01S 5/18313 372/45.01 |
| 2010/0277669 A1 * | 11/2010 | Adachi | G02B 6/0056 349/62 |
| 2010/0303116 A1 * | 12/2010 | Murayama | B82Y 20/00 372/49.01 |
| 2010/0309943 A1 * | 12/2010 | Chakraborty | B82Y 20/00 372/45.012 |
| 2011/0044365 A1 * | 2/2011 | Chen | B82Y 20/00 372/45.012 |
| 2011/0068360 A1 | 3/2011 | Nago et al. | |
| 2011/0075694 A1 * | 3/2011 | Yoshizumi | B82Y 20/00 372/45.01 |
| 2011/0149201 A1 * | 6/2011 | Powell | G02F 1/133615 349/62 |
| 2011/0158277 A1 * | 6/2011 | Yoshizumi | B82Y 20/00 372/44.011 |
| 2011/0170568 A1 * | 7/2011 | Kondo | H01S 5/18311 372/45.01 |
| 2011/0227487 A1 * | 9/2011 | Nichol | G02B 6/0018 315/158 |
| 2011/0260188 A1 * | 10/2011 | Choi | H01L 33/46 257/98 |
| 2011/0273906 A1 * | 11/2011 | Nichol | G02B 6/0076 362/607 |
| 2012/0012856 A1 * | 1/2012 | Chen | H01L 33/22 257/76 |
| 2012/0032215 A1 * | 2/2012 | Saito | B82Y 20/00 257/98 |
| 2012/0086022 A1 * | 4/2012 | Veerasamy | H01L 33/22 257/88 |
| 2012/0086023 A1 * | 4/2012 | Veerasamy | C03C 17/009 257/88 |
| 2012/0088319 A1 * | 4/2012 | Veerasamy | B05D 5/06 438/27 |
| 2012/0147727 A1 * | 6/2012 | Kondo | G02B 6/4206 369/121 |
| 2012/0268809 A1 * | 10/2012 | Guo | G02F 1/216 359/359 |
| 2012/0269222 A1 * | 10/2012 | Kyono | H01S 5/3201 372/45.011 |
| 2012/0292649 A1 * | 11/2012 | Sugiyama | H01L 21/02381 257/94 |
| 2012/0299051 A1 * | 11/2012 | Jeong | H01L 33/405 257/99 |
| 2013/0037820 A1 * | 2/2013 | Tsukihara | H01L 33/32 257/76 |
| 2013/0126921 A1 * | 5/2013 | Mohammed | H01L 33/0079 257/98 |
| 2013/0127364 A1 * | 5/2013 | Mohammed | H01L 21/78 315/246 |

(56) References Cited

U.S. PATENT DOCUMENTS

| | | | |
|---|---|---|---|
| 2013/0234108 A1* | 9/2013 | David | H01L 33/58 257/13 |
| 2014/0307205 A1* | 10/2014 | Banerjee | G02B 5/3041 349/65 |
| 2015/0010265 A1* | 1/2015 | Popovich | G02F 1/13342 385/10 |
| 2015/0023380 A1* | 1/2015 | Shigihara | H01S 5/222 372/45.01 |
| 2015/0140710 A1* | 5/2015 | McLaurin | H01S 5/34333 438/31 |
| 2015/0229108 A1* | 8/2015 | Steigerwald | H01S 5/4093 372/45.01 |
| 2016/0343908 A1* | 11/2016 | Aldaz | H01L 33/22 |
| 2017/0051884 A1* | 2/2017 | Raring | H01S 5/02236 |
| 2017/0104972 A1* | 4/2017 | Novotny | H04N 9/77 |
| 2017/0317237 A1* | 11/2017 | Gardner | H01L 33/32 |
| 2018/0013036 A1* | 1/2018 | Katona | H05B 33/0842 |
| 2018/0013265 A1* | 1/2018 | McLaurin | H01S 5/0215 |

FOREIGN PATENT DOCUMENTS

| | | |
|---|---|---|
| CN | 101032034 | 9/2007 |
| CN | 101165933 | 4/2008 |
| CN | 102237465 | 11/2011 |
| JP | 2003-060227 A | 2/2003 |

* cited by examiner

LIGHT EMITTING DIODE WITH LOW REFRACTIVE INDEX MATERIAL LAYERS TO REDUCE LIGHT GUIDING EFFECTS

CROSS-REFERENCE TO RELATED APPLICATIONS

This application is a continuation application of U.S. application Ser. No. 13/787,582, filed Mar. 6, 2013, now allowed, which claims the benefit under 35 U.S.C. § 119(e) of U.S. Provisional Application No. 61/607,188 filed on Mar. 6, 2012, both of which are incorporated by reference herein in their entireties.

FIELD

The disclosure relates to the field of light extraction from light-emitting diodes (LEDs), and more particularly to for the use of low refractive index material layers to reduce light guiding effects in light emitting diodes.

BACKGROUND

The issue of light extraction from light-emitting diodes (LEDs) is well-known. LEDs are made of a high refractive index semiconductor material. Unfortunately, a fraction of the light generated by the LED internally reflects from the interfaces with the outside medium (either air or an encapsulant) due to total internal reflection. This light is called guided light. Its existence is detrimental to the performance of the LED because it limits light extraction. Various approaches can be used to extract guided light, such as shaping the LED, or roughening some of the surfaces. These approaches aim at breaking the guided trajectories so as to increase light extraction. However, conventional techniques fail to reduce the guided light and thereby fail to maximize light extraction from LEDs.

Therefore, improved methods for increasing light extraction efficiency and in particular reducing guided light in LEDs is desired.

BRIEF SUMMARY

Light emitting diodes including low refractive index layers for reducing guided light are disclosed. The light-emitting diodes include at least one n-doped layer, at least one p-doped layer, and an active region disposed between the at least one n-doped layer and the at least one p-doped layer. The active region comprises a light-emitting material. The light-emitting diode further comprises at least one low refractive index layer disposed in or around the active region.

In a first aspect, light-emitting diodes are provided comprising: at least one n-doped layer; at least one p-doped layer; an active region comprising of at least one layer of light-emitting material, disposed between the at least one n-doped layer and the at least one p-doped layer; and at least one low refractive index layer disposed within one optical wavelength of the active region, the low refractive index layer configured to substantially reduce light guiding by the active region.

In a second aspect, light-emitting diodes are provided comprising: at least one n-doped layer comprising a gallium-nitride-based material at least one p-doped layer comprising a gallium-nitride-based material; an AlGaN/InGaN superlattice characterized by an average refractive index that is less than whose average index does not exceed that of GaN by more than 0.05; an active region comprising a series of quantum wells or one or more double heterostructures, wherein the active region is characterized by a total thickness of less than 50 nm; and an electron blocking layer whose refractive index is lower than that of GaN minus 0.05.

In a third aspect, light-emitting diodes are provided comprising: at least one n-doped layer comprising a gallium-nitride-based material; at least one p-doped layer comprising a gallium-nitride-based material; an active region disposed between the at least one n-doped layer and the at least one p-doped layer, the active region comprising one or more layers formed of an indium-gallium-nitride-based material; and at least one low refractive index material layer disposed between the at least one p-doped layer and the active region, or between the at least one n-doped layer and the active region, wherein the at least one low refractive index material layer has an index of refraction lower than an index of refraction of gallium nitride.

In a fourth aspect, methods of fabricating a light-emitting diode are provided comprising: providing a substrate, the substrate including a surface region comprising a gallium-nitride-based material; forming at least one n-doped layer coupled to the surface region of the substrate, the at least one n-doped layer comprising a gallium-nitride-based material; forming an active region coupled to the n-doped layer, the active region comprising one or more layers formed of an indium-gallium-nitride-based material; forming at least one p-doped layer coupled to the active region, the at least one p-doped layer comprising a gallium-nitride-based material; and forming at least one low refractive index material layer disposed between the at least one p-doped layer and the active region, or between the at least one n-doped layer and the active region, wherein the at least one low refractive index layer has an index of refraction lower than an index of refraction of gallium nitride and the low refractive index layer is formed to substantially reduce light guiding by the active region.

DETAILED DESCRIPTION OF EMBODIMENTS

Various embodiments will now be described more fully hereinafter with reference to the accompanying drawings, in which exemplary embodiments are shown. Various aspects may, however, be embodied in many different forms and should not be construed as limited to the embodiments set forth herein. Rather, these embodiments are provided so that this disclosure will be thorough and complete, and will fully convey the scope of the invention to those skilled in the art.

Some embodiments of the present disclosure are directed to an improved approach for implementing light emitting diodes with low refractive index material (LIM) layers to reduce light guiding effects. More particularly, disclosed herein are methods and systems for light emitting diode with LIM layers to reduce light guiding effects.

The issue of light extraction from light-emitting diodes (LEDs) is well-known. LEDs are made of a high refractive index semiconductor material. Unfortunately, a fraction of the light generated in the LED reflects from the interfaces with the outside medium (either air or an encapsulant) due to total internal reflection and into the active region. This light is called guided light. Its existence is detrimental to the performance of the LED because it limits light extraction. Various approaches can be used to extract guided light, such as shaping the LED, or roughening the surfaces of the LED. These approaches aim at breaking the guided trajectories so as to increase light extraction. However, conventional techniques fail to consider the aspect of minimizing or eliminating guided light within the active region. Moreover, applications of the aforementioned conventional techniques do not result in designs of light emitting diodes that employ LIM layers to reduce light guiding effects.

Figure 1:
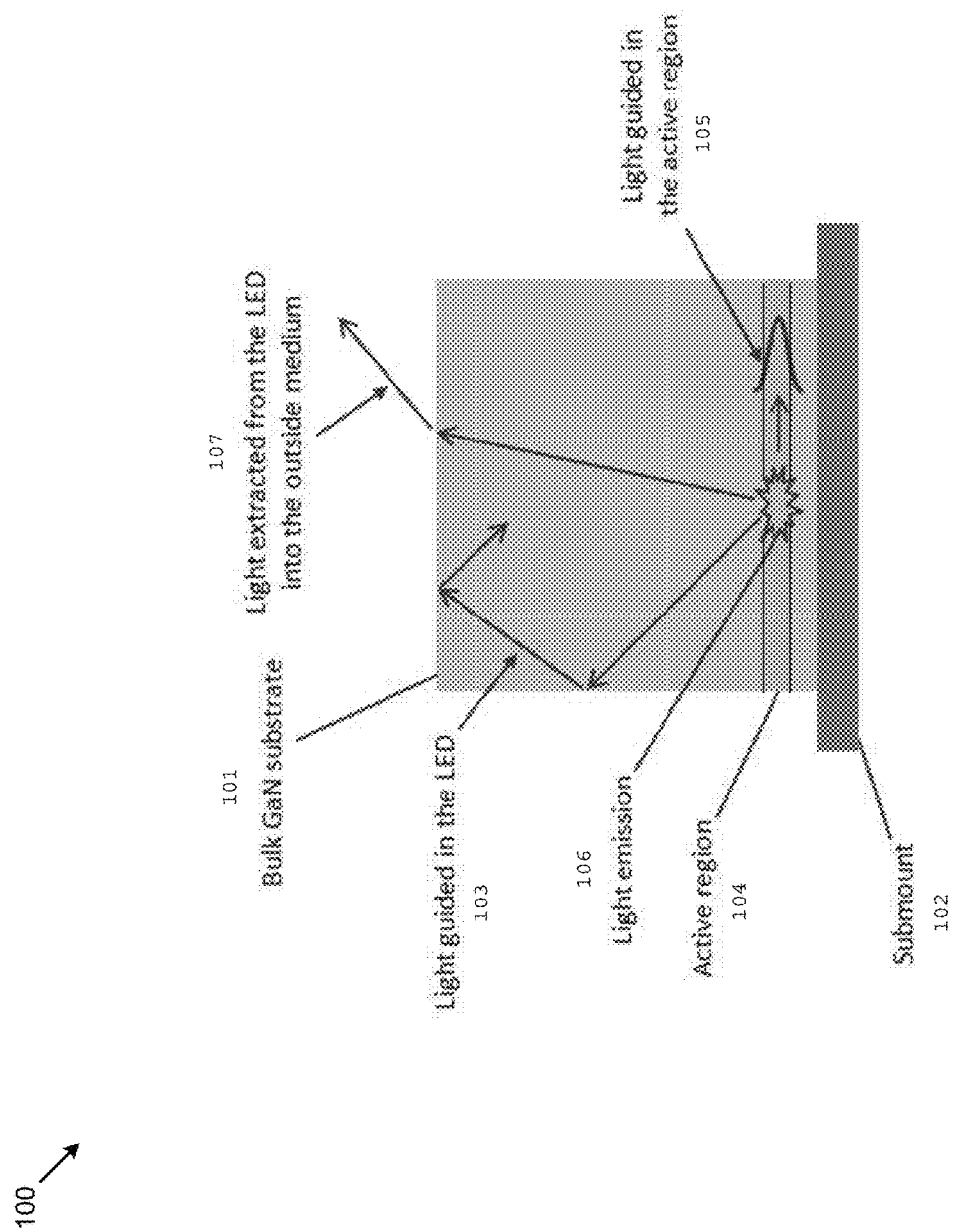
FIG. 1 is a simplified diagram of an LED grown on a GaN substrate, according to some embodiments.

FIG. 1 shows a simplified diagram of an LED 100 grown on a GaN substrate, according to some embodiments. The LED grown on a bulk GaN substrate 101 is flipped on a submount 102. In addition to the light guided in the LED due to total internal reflection at the GaN/air interface 103, the active region 104 provides additional guiding 105. A profile of guided light 105 is depicted on the right side of the active region 104.

Figure 2:
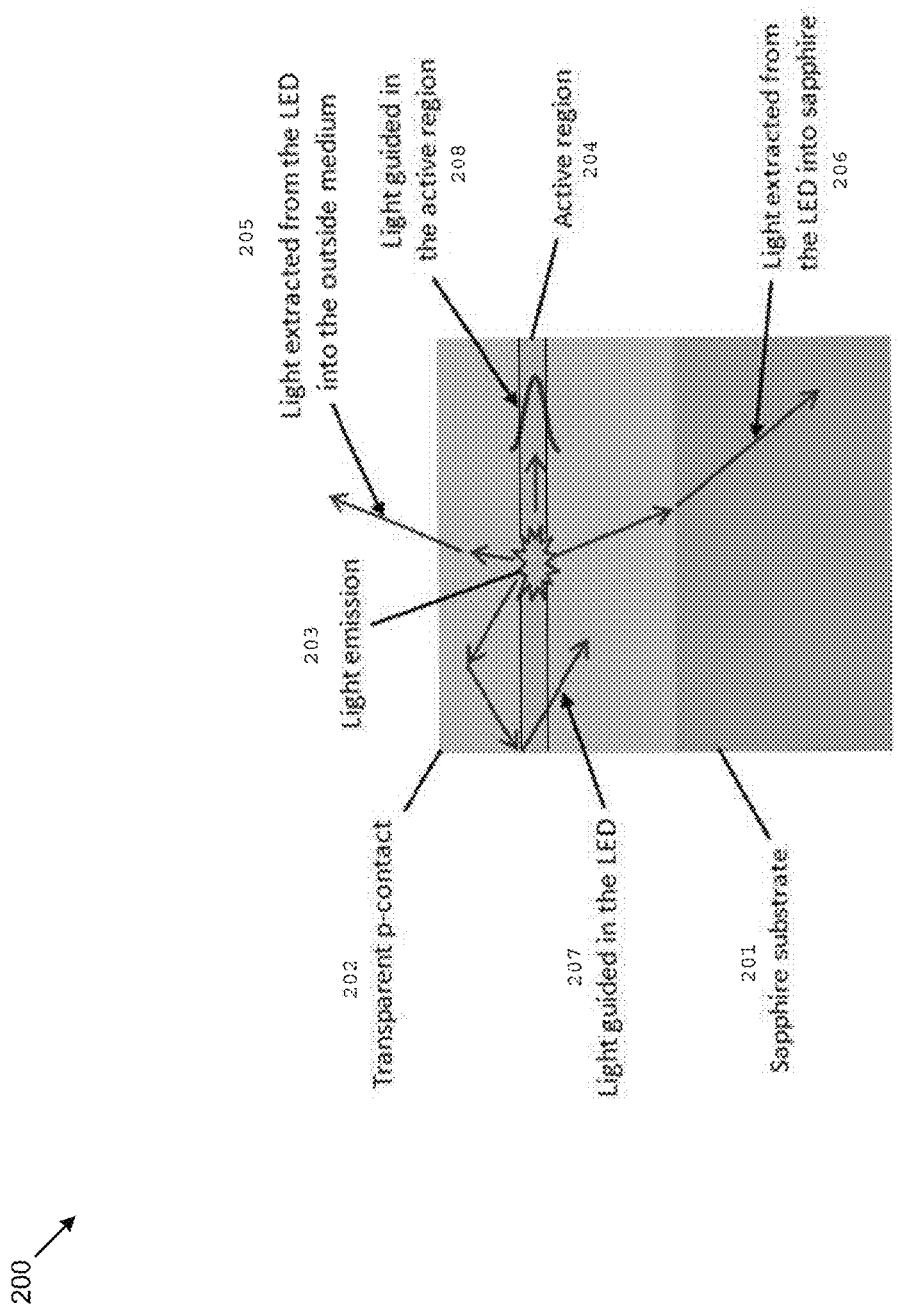
FIG. 2 is a simplified diagram of an LED grown on a sapphire substrate with a transparent p-contact, according to some embodiments.

As illustrated in FIG. 1, the LED is grown on a bulk gallium nitride (GaN) substrate 101, and placed on a submount 102 which can serve as a p-contact. Light 106 is emitted by the active region 104. Some light trajectories are extracted to the outside medium 107, while other trajectories 103 are guided within the LED structures. Another channel for light guiding can exist which is usually not addressed in conventional designs, namely the additional light guiding effects 105 within the active region 104 of the LED. The additional light guiding effects 105 within the active region 104 of the LED apply to the LED of FIG. 1 as well as to other types of LED configurations, for example, the LED illustrated in FIG. 2. GaN constitutes both the substrate material of the LED, and its host material (i.e. the material grown on the substrate and constituting the matrix of the epitaxial layers, in which other LED layers are embedded FIG. 2 shows a simplified diagram of an LED 200 grown on a sapphire substrate 201 with a transparent p-contact 202, according to some embodiments. Light 203 is emitted by the active region 204. Some light trajectories are extracted to the outside medium 205, others are extracted into the sapphire substrate 206, and others 207 are guided within the LED. Besides the light guided in the LED due to total internal reflection 205 at the GaN/air interface, the active region 204 provides additional guiding 208. In some embodiments of an LED, the active region 204 comprises light-emitting layers characterized by a refractive index that is larger than that of the host material of the LED. For example, in the case of a Group III-nitride LED, the active region is usually a stack of alternating InGaN quantum wells and gallium nitride quantum barriers (QB) grown on a gallium nitride host layer, the refractive index of InGaN being larger than that of GaN. In some cases the quantum well/quantum barrier stack can be replaced by a double-heterostructure active region. Here, the substrate is sapphire while the host material is GaN.

If the composition/number/thickness of the quantum well stack is large enough, the active region can support one or more guided modes. Many commercial LEDs include either a GaN/InGaN superlattice or a bulk InGaN layer with moderate indium composition grown below the active region. This layer can also lead to undesired light guiding and/or increase the guiding effect caused by the active region.

As used herein, the term "guided mode" refers to guided light in the active region (GLAR) and in the vicinity of the active region rather than to the regular light guided in the bulk (e.g., regions other than the—active region) of the LED. The fate of the guided light in the active region (GLAR) is different from the fate of non-GLAR guided light. Non-GLAR guided light impinges on various interfaces with the outside medium, so that shaping or texturing of these interfaces can lead to improved light extraction. The GLAR, on the other hand, is confined to the vicinity of the active region only and can only propagate laterally across this layer. Therefore, conventional techniques for improved light extraction do not substantially affect GLAR.

In general, the existence of GLAR is due to the index contrast between layers of high refractive index such as the light-emitting layers and surrounding layers of lower refractive index. The layers of low refractive index may include the so-called host material, i.e. the material matrix grown on the substrate and in which various other LED layers are embedded. For instance, the host material is GaN both in the case of a bulk GaN LED and of a GaN LED on a sapphire substrate. The layers of high refractive index may include the light-emitting layers, and other layers such as a superlattice that are in the vicinity of the active region. GLAR may be characterized by the fact that it is evanescent in the host material or some other low refractive index layers, but is propagative in some high-index layers.

Upon its propagation, the GLAR can be re-absorbed by the active region, or be absorbed by other layers, such as by lossy contacts. In the case of re-absorption by the active region, the created carrier pairs can further be re-emitted as light and thus undergo multiple absorption-emission cycles. This multiple absorption-emission process, however, has a lower efficiency than a single absorption-emission cycle because the internal quantum efficiency of the active region is less than unity.

Figure 3:
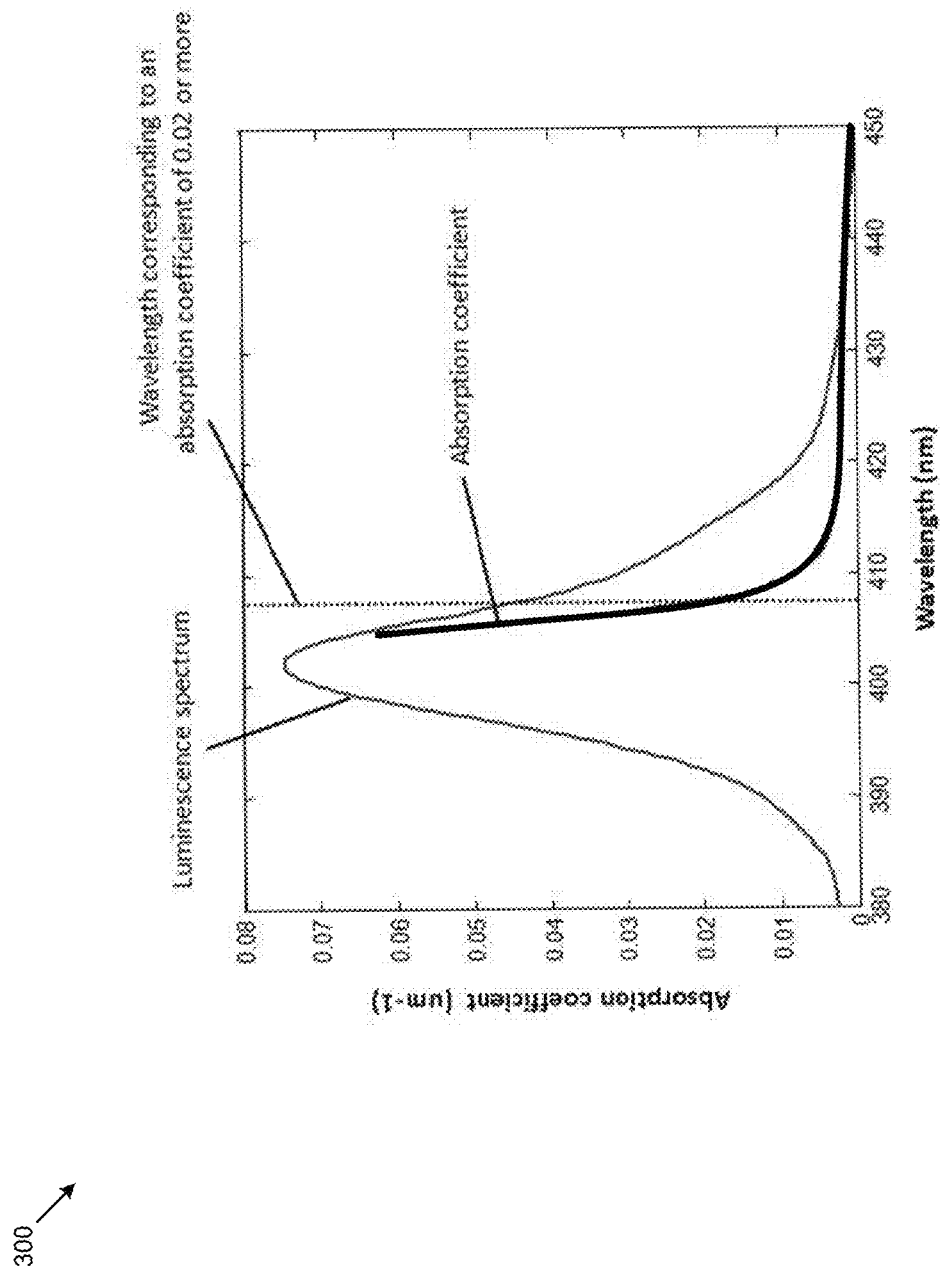
FIG. 3 shows experimental results of a luminescence spectrum and an absorption spectrum of an LED emitting light at a wavelength of about 400 nm and with guided light in the active region, according to some embodiments.

FIG. 3 shows experimental results of a luminescence spectrum and an absorption spectrum of an LED emitting light at a wavelength of about 400 nm and with guided light in the active region, according to some embodiments. The dotted line indicates the wavelength below which the absorption coefficient is larger than about 0.02 $\mu m^{-1}$. This value is chosen in this depiction because it corresponds to a light absorption length of 50 μm, which is a small length compared to the lateral length of an LED. Therefore, guided light at the corresponding wavelength will be re-absorbed by the active region before it can propagate a significant lateral distance within the LED. Once a guided mode is supported, it can carry a large fraction of the total spontaneous emission of the active region.

Figure 4:
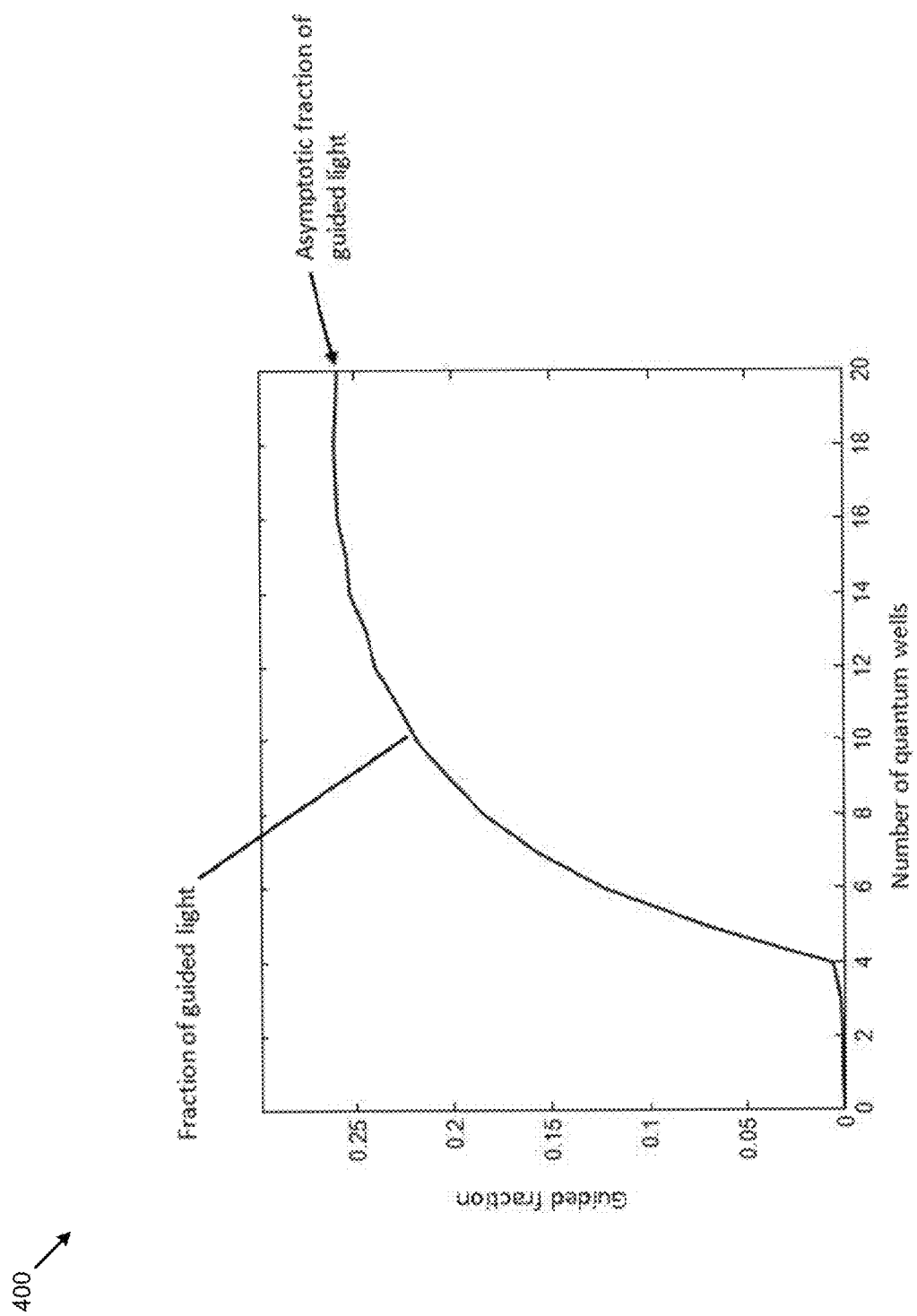
FIG. 4 is a chart illustrating modeling results for the fraction of light being guided in the active region of an LED as a function of the number of quantum wells, according to some embodiments.

FIG. 4 is a chart illustrating modeling results for the fraction of light being guided in the active region of an LED as a function of the number of quantum wells, according to some embodiments. In the modeling, a refractive index step of 0.2 between GaN and InGaN is used. This value is a realistic value as known in the art. As illustrated in FIG. 4, if more than eight quantum wells are used, up to 20% of the total emitted light is guided. For a large number of quantum wells, the fraction of GLAR reaches an asymptotic value of over 25%. Thus a substantial portion of the total power of the LED can be emitted as GLAR and ultimately lost to absorption, thus decreasing the performance of the LED. It is therefore desirable to avoid GLAR, or to limit its magnitude to a GLAR value that represents less than 5% of the total emitted light.

Further discussion herein describes how layers of LIM can be used to reduce the fraction of light being guided in the active region in an LED. Some commercial LEDs include an AlGaN layer characterized by a low refractive index and that serves as an electron-blocking layer that is formed overlying the active region. However, the thickness and refractive index of the electron-blocking layer are sometimes not sufficient to substantially reduce the amount of GLAR. Placement, thickness, and composition of the low refractive index material should be selected to substantially reduce GLAR, as described below.

Figure 5:
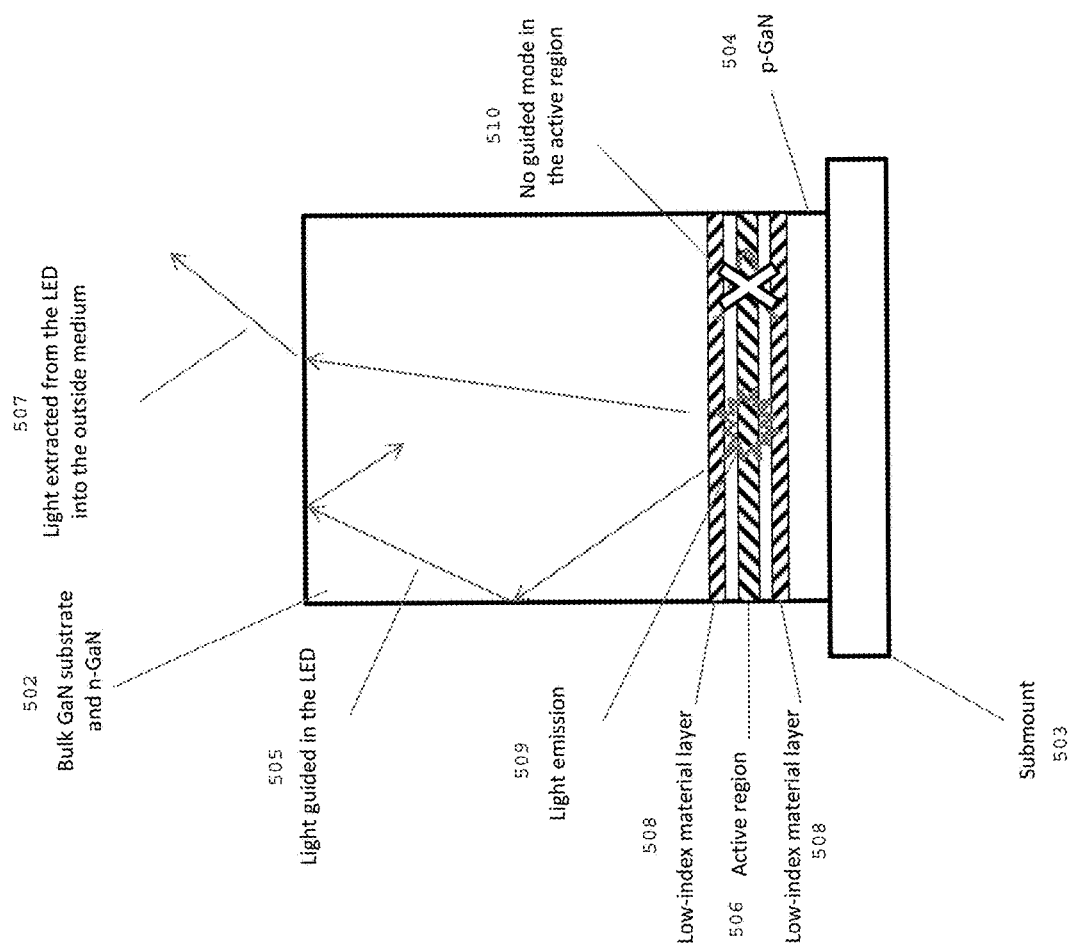
FIG. 5 is a simplified diagram illustrating an LED with low refractive index layers straddling the active region, according to some embodiments.

FIG. 5 is a simplified diagram illustrating an LED with low refractive index layers 508 on either side of the active region 506, according to some embodiments. The LED grown on a bulk GaN substrate and n-GaN layer 502 is flipped such that the p-GaN layer 504 is on a submount 503, and comprises two low refractive index material layers 508 on either side of the active region 506. The presence of the low refractive index material layers 508 reduces the fraction of light being guided in the active region 506. Other light trajectories may exist for light 509 emitted by the active region 506, such as light propagating to the outside medium 507 and light guided in the host material 505 of the LED. Conventional light-extracting features may be added to the LED to help extract such forms of light. For example, the LED device can be shaped into a cubic shape, a triangular shape, a tetragonal shape, or a pyramidal shape. As shown, the presence of low refractive index layers 508 minimizes or prevents a guided mode in the active region 510.

In some embodiments, a low refractive index material layer overlies the active region. The low refractive index material layer is thick enough and has an index of refractive low enough, such that the wavefunction of the guided mode is spread out away from the active region, thereby reducing or suppressing light emission/propagation within the guided mode. According to certain embodiments, the low refractive index material has an index of refraction lower than the index of refraction of GaN.

Figure 6:
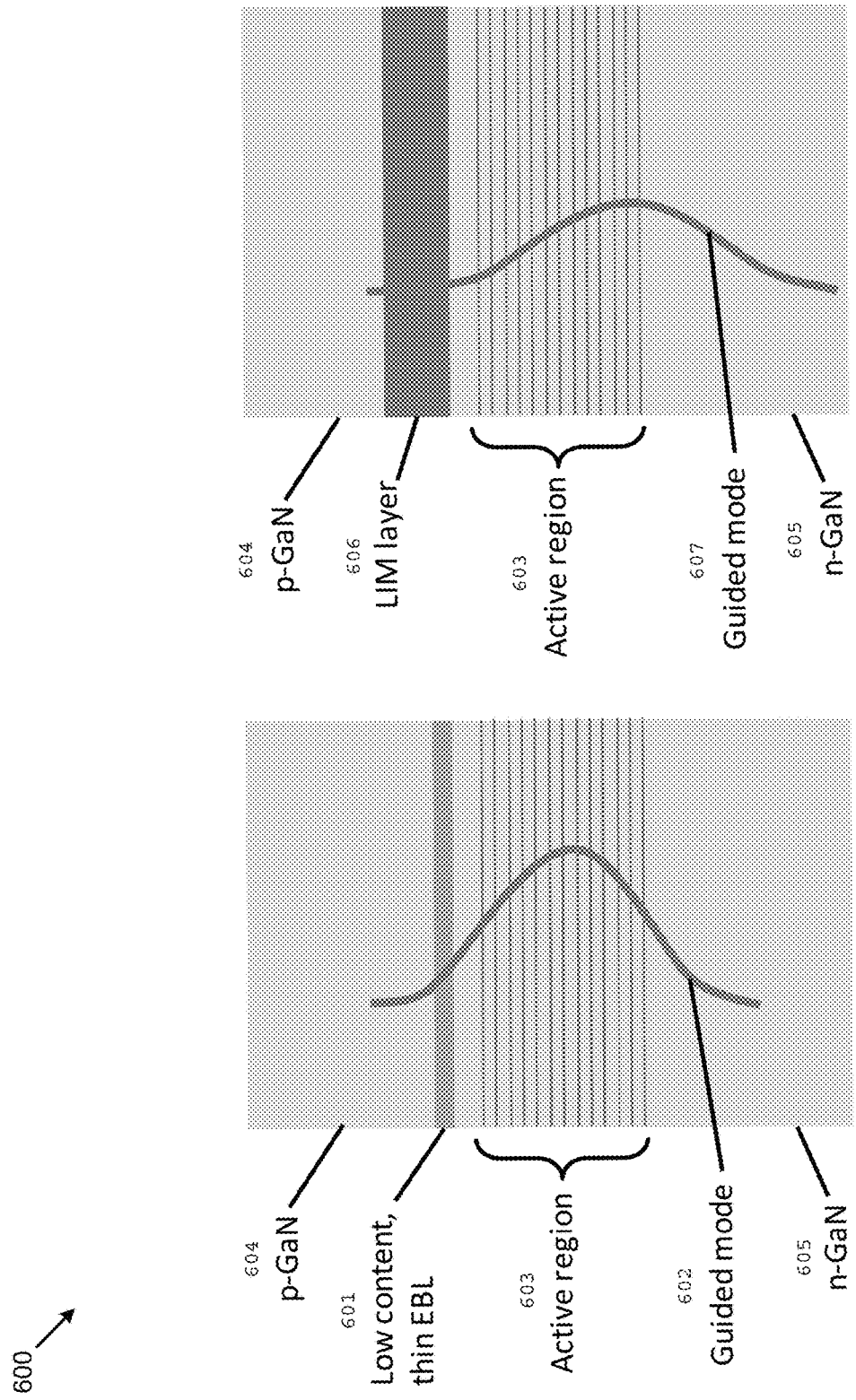
FIGS. 6A and 6B are simplified diagrams illustrating guided mode profiles in an LED with a design having an electron blocking layer, and a design having a low refractive index material layer, respectively, according to some embodiments.

FIGS. 6A and 6B contrast s guided mode profile shapes 600 between designs having a conventional electron blocking layer (FIG. 6A) and a light emitting diode where the electron blocking layer is also designed as a low refractive index material layer to reduce light guiding effects (FIG. 6B). FIGS. 6A and 6B show sketches of LED structures in order to provide details of structure in and around the vicinity of the active region. The guided mode profile is shown superimposed on the detail.

FIG. 6A shows a conventional LED structure, having a thin, low-content AlGaN electron-blocking layer 601. FIG. 6A shows a p-GaN layer 604 overlying a low-content AlGaN electron-blocking layer 601 overlying active region 603, which overlies n-GaN layer 605. As shown, the guided mode 602 is strongly confined in the active region 603.

FIG. 6B is in accordance with certain embodiments, with a low refractive index material layer 606 of sufficient thickness and low index to push the guided mode profile 607 away from the active region 603. The low refractive index material layer 606 can also serve the usual functions of an electron blocking layer, such as carrier confinement.

FIGS. 6A and 6B are simplified diagrams illustrating guided mode profiles in an LED with a design having an electron blocking layer, and a design having a low refractive index material layer, respectively, according to some embodiments. The conventional structure includes a stack having a p-doped layer, an n-doped layer, an active region (made of a stack of quantum wells) and a thin AlGaN electron-blocking layer (EBL). In this structure, the guided mode is well confined in the active region. Since light emission into the guided mode is proportional to its overlap with the active region, the amount of GLAR is large.

In contrast, in the structure with a low refractive index material (LIM) layer as shown in FIG. 6B, the conventional electron-blocking layer is replaced by a thicker layer with a lower index of refraction. The low refractive index material serves as an electron-blocking layer and also significantly spreads the profile of the guided mode away from the active region, so that the amount of GLAR is reduced. In certain embodiments, a low refractive index material layer is within at least one optical wavelength of the active region, where the optical wavelength is the emission wavelength or wavelength range of the LED. In certain embodiments, a low refractive index layer is within 500 nm of the active region, within 300 nm of the active region, within 200 nm of the active region, and in certain embodiments, within 100 nm of the active region. A low refractive index layer may be within an active region, adjacent the active region, or within a region adjacent the active region, such as a cladding layer, a p-doped layer, or an –n-doped layer. In certain embodiments, a low refractive index layer made be disposed in any combination of the foregoing. As used herein, when a layer is referred to as being above or below another layer, the relative position is not intended to be absolute and will depend on the orientation of a LED. Similarly, overlying and underlying to not denote absolute positions but rather depend on the orientation of a particular LED.

Figure 7:
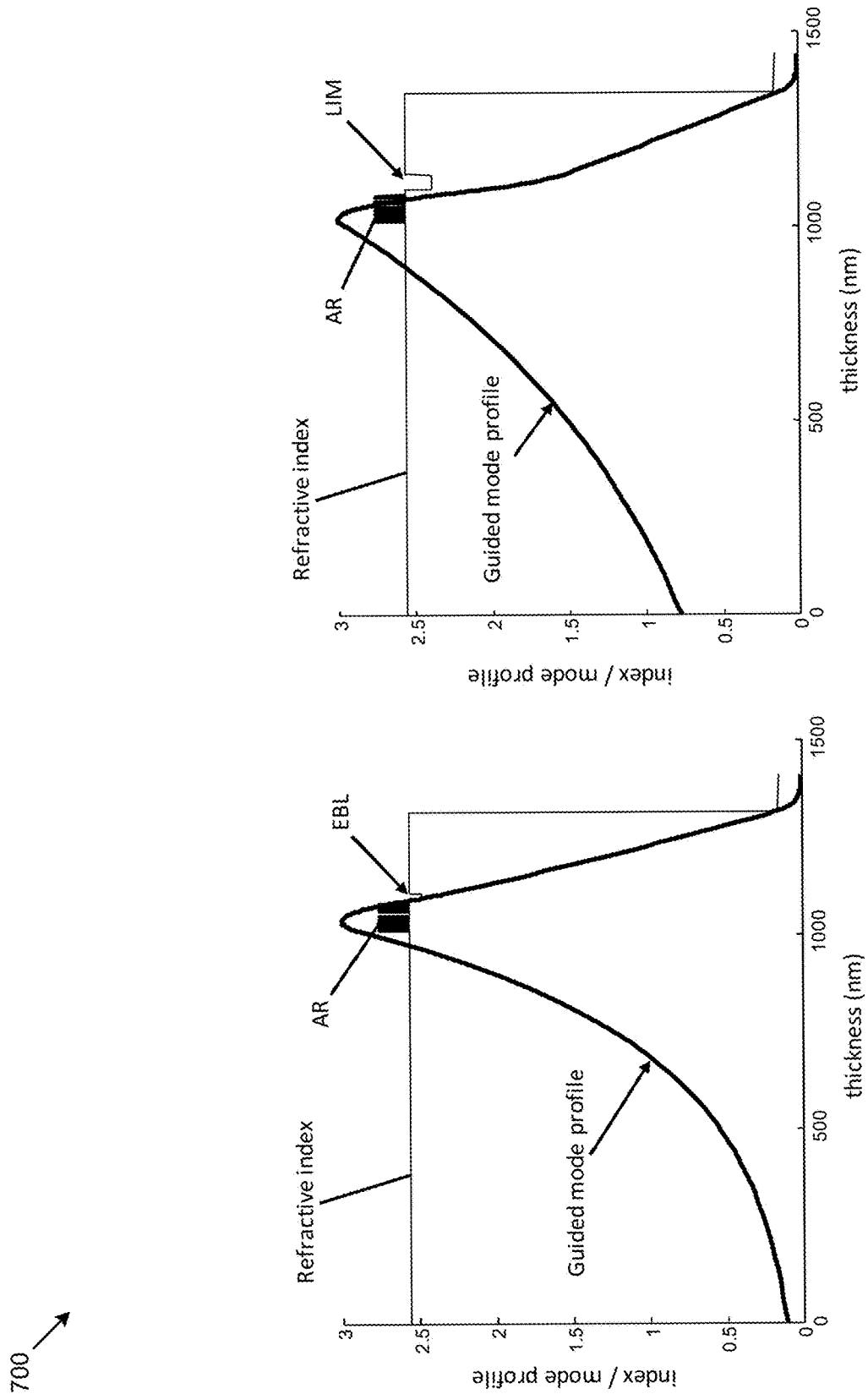
FIGS. 7A and 7B illustrate modeled guided mode profiles for an LED with a design having an electron blocking layer, and a design having a low refractive index material layer, respectively, according to some embodiments. The index profiles for both designs are also shown.

FIGS. 7A and 7B illustrate modeled guided mode profiles for an LED with a design having an electron blocking layer (EBL), and a design having a low refractive index material (LIM) layer, respectively, according to some embodiments. For both FIGS. 7A and 7B, each LED includes ten quantum wells in the active region.

FIGS. 7A and 7B also show the index profiles of the LEDs. FIG. 7A shows an index profile based on an LED structure that includes a metallic contact on the p-side and an AlGaN electron-blocking layer ($Al_{15}GaN$, 10 nm thick).

FIG. 7B shows an index profile based on an LED structure where the electron-blocking layer is replaced by a low refractive index material layer ($Al_{83}InN$, 40 nm thick). Here the low refractive index material serves as an electron-blocking layer and also substantially reduces light guiding. As can be seen in FIG. 7A, the guided mode is well confined by the active region, despite the presence of an electron-blocking layer. In contrast, as can be seen in FIG. 7B, the confinement is reduced.

Figure 8:
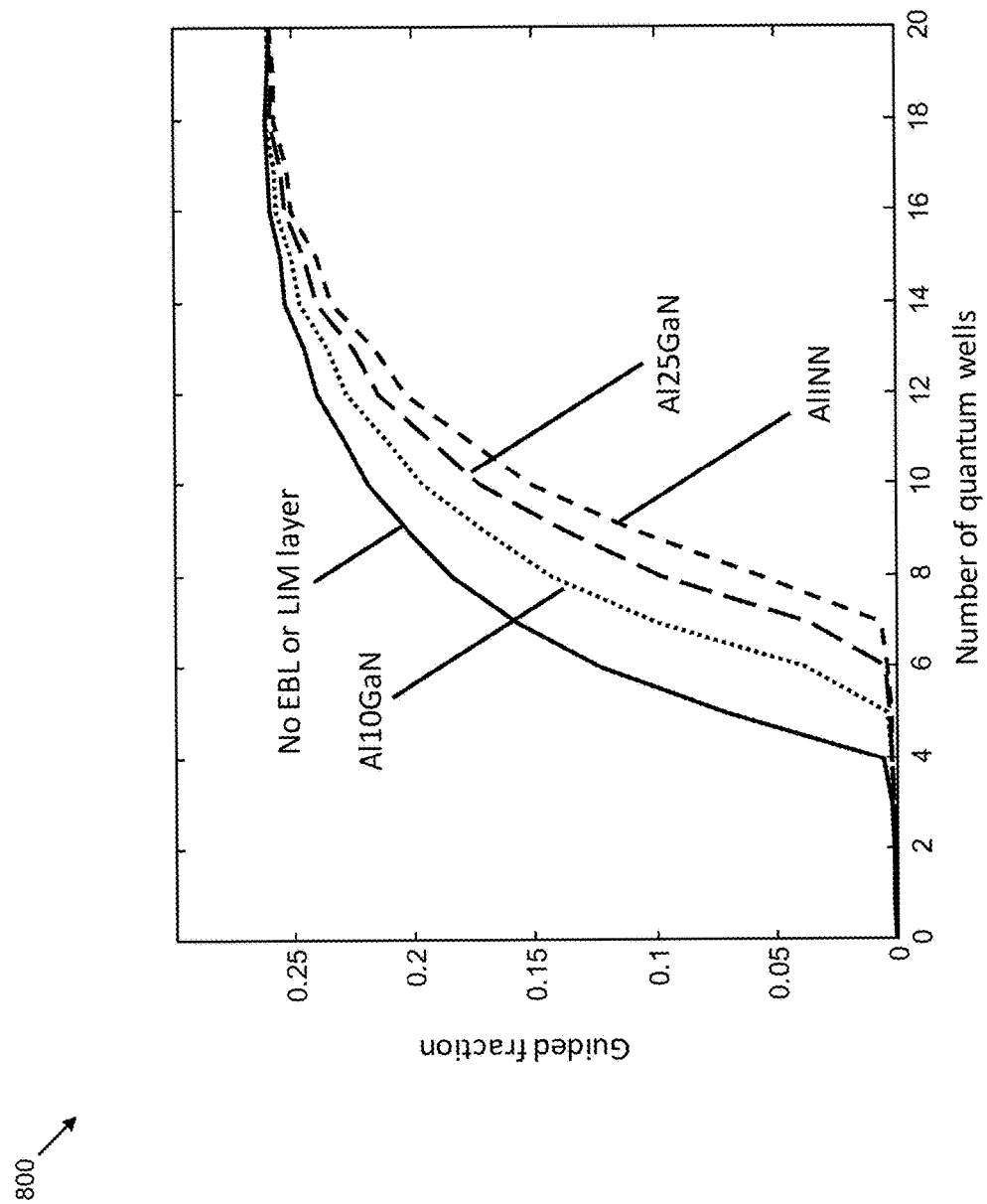
FIG. 8 illustrates modeling results for the fraction of light being guided in the active region of an LED as a function of number of quantum wells, with various compositions in a low refractive index material layer, according to some embodiments. The modeling results for an LED structure with no electron-blocking layer and no low refractive index material layer is shown for reference.

FIG. 8 illustrates modeling results for the fraction of light being guided within the active region of an LED as a function of the number of quantum wells, with various compositions of a low refractive index material layer. The low refractive index material layer is assumed to be 20 nm thick in the modeling. The modeling results for an LED structure with no electron-blocking layer and no low refractive index material layer is shown for reference (solid line).

As can been seen in FIG. 8, in the absence of any electron-blocking layer or low refractive index material (solid line), guiding is strongest. Inserting an electron-blocking layer ($Al_{10}GaN$, 20 nm thick) slightly reduces guiding. Using a low refractive index material made of $Al_{25}GaN$ or of AlInN lattice-matched to the GaN host, each of which has an index of refraction lower than that of $Al_{10}GaN$, reduces guiding still more. Some designs in accordance with the compositions and thicknesses can substantially reduce the amount of GLAR, especially when the number of quantum wells in the active region is about 5 to about 8. In some embodiments, one or several low refractive index material layers are inserted above and/or below the active region, e.g., toward the n-GaN and/or p-GaN layers.

Figure 9:
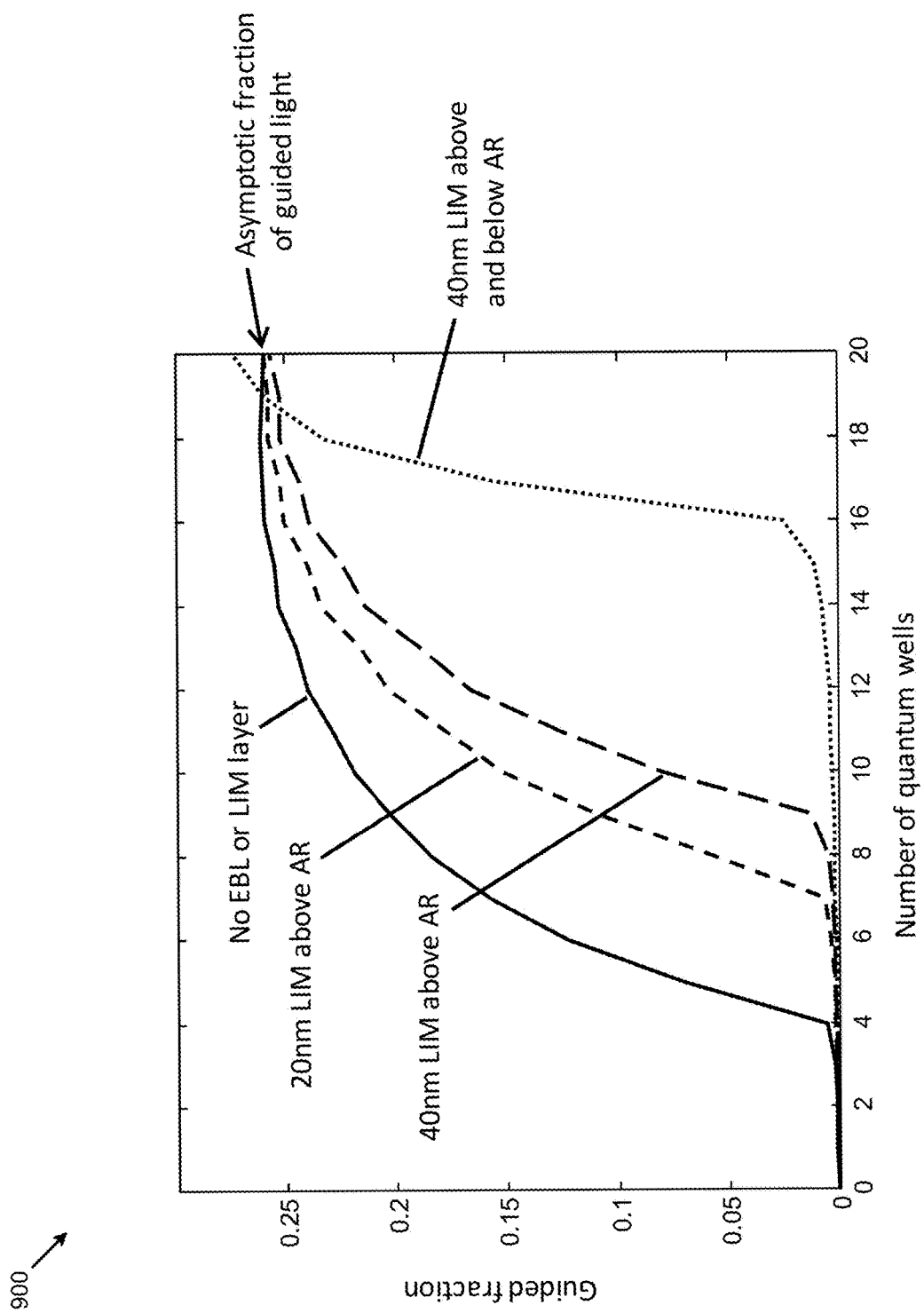
FIG. 9 illustrates modeling results for the fraction of light being guided in the active region of an LED as a function of number of quantum wells, for various thicknesses of a low refractive index material layer, according to some embodiments. The modeling results for an LED structure with no electron-blocking layer and no low refractive index material layer is shown for reference.

FIG. 9 illustrates modeling results for the fraction of light being guided in the active region of an LED as a function of number of quantum wells, for various thicknesses of a low refractive index material layer, according to some embodiments. The low refractive index material comprises AlInN lattice-matched to GaN. The modeling results for an LED structure with no electron-blocking layer and no low refractive index material layer is shown for reference (solid line). FIG. 9 further illustrates how the thickness and number of low refractive index material layers impact guided light emission. As can be seen in FIG. 9, placing a 20 nm-thick low refractive index material layer above the active region reduces guiding as compared to an LED structure with no electron blocking layer and no low refractive index material layer. By increasing the thickness of the low refractive index material layer, for example to 40 nm thick, the fraction of guided light is further reduced. Further, placing two 40 nm-thick low refractive index material layer son both sides of the active region reduces guiding even more. In the last case, GLAR is substantially reduced or prevented even when the active region comprises 15 quantum wells.

The embodiments presented above are shown to reduce the amount of GLAR for a given number of quantum wells, but any of the shown variations do not significantly affect the asymptotic fraction of GLAR for a structure with many quantum wells (e.g., 20 quantum wells or more). This asymptotic value can be reduced by lowering the average refractive index in the active region. This is realized in some embodiments, such as the embodiments shown and described in FIG. 10, where the quantum barriers are made of a low refractive index material.

Figure 10:
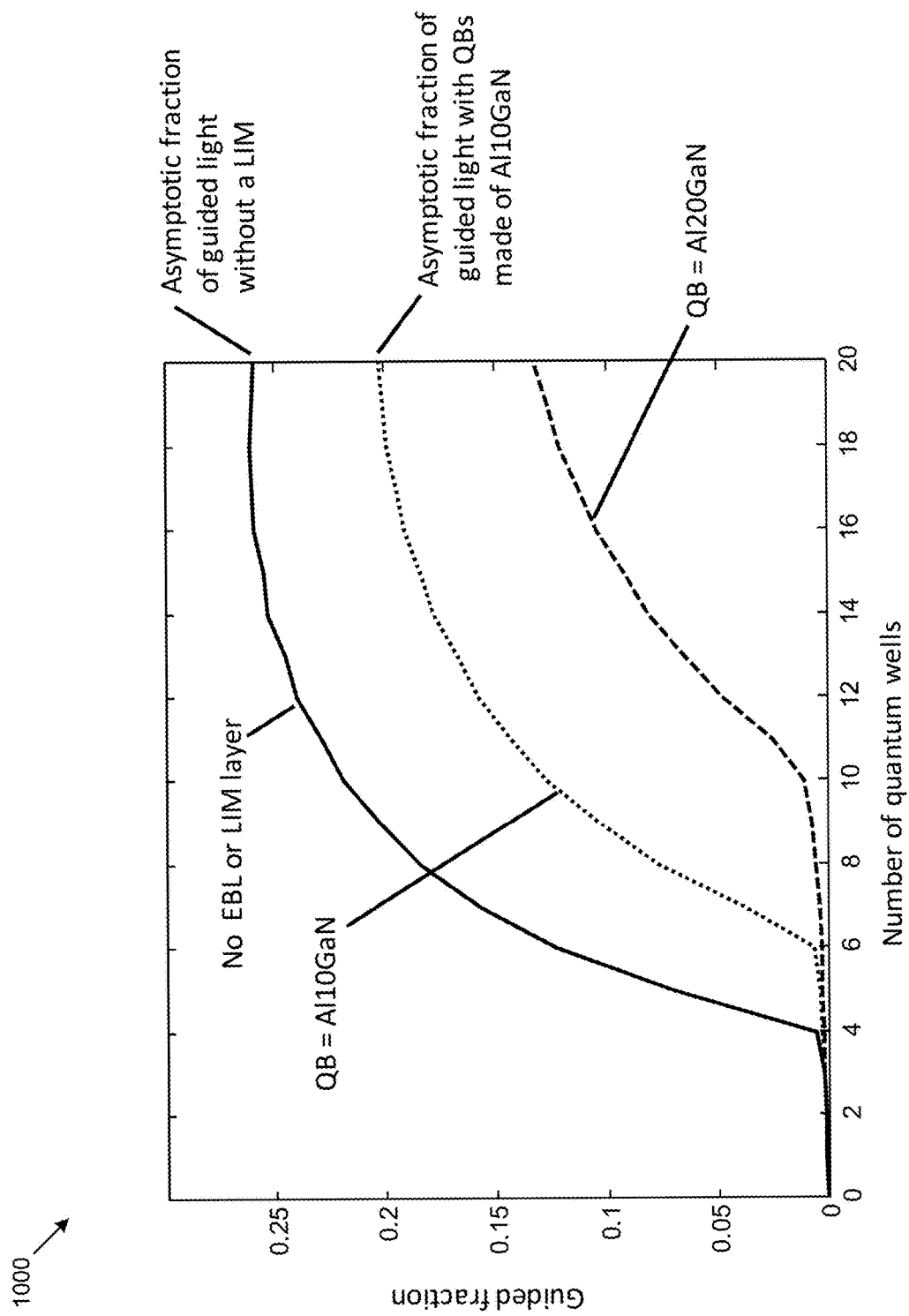
FIG. 10 illustrates modeling results for the fraction of light being guided in the active region of an LED as a function of number of quantum wells, for various compositions of quantum barriers, according to some embodiments. The modeling results for an LED structure with no electron-blocking layer and no low refractive index material layer is shown for reference.

FIG. 10 illustrates modeling results for the fraction of light being guided in the active region of an LED as a function of number of quantum wells, for various compositions of quantum barriers, according to some embodiments. FIG. 10 illustrates how the composition of the quantum barriers impacts guided light emission. The modeling results for an LED structure with no electron-blocking layer and no low refractive index material layer is shown for reference (solid line). As can be seen in FIG. 10, when the quantum barriers are made of $Al_{10}GaN$, the fraction of GLAR for a given number of quantum wells is reduced as compared to an LED structure with no electron blocking layer and no low refractive index material layer. Furthermore, the asymptotic fraction of GLAR is also reduced. When the quantum barriers are made of $Al_{20}GaN$, which has an index of refraction lower than that of $Al_{10}GaN$, both the fraction of GLAR for a given number of quantum wells and the asymptotic fraction of GLAR are further reduced.

Some embodiments may combine low refractive index material layers placed above and below the active region with quantum barriers made of low refractive index material.

Figure 11:
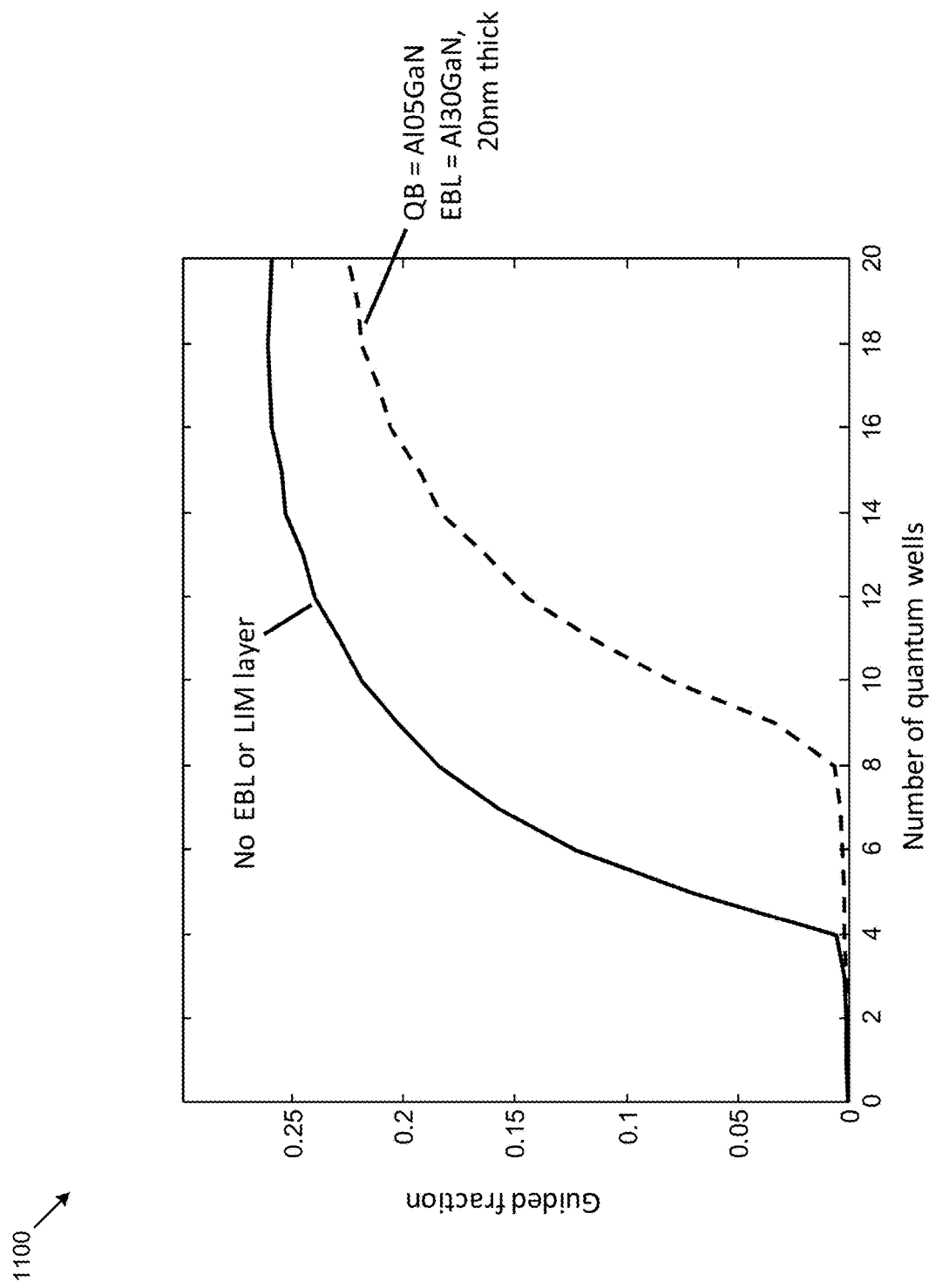
FIG. 11 Shows modeling results for the fraction of light being guided in the active region of an LED that includes low refractive index material barriers and low refractive index material electron barrier layers, as a function of the number of quantum wells, according to some embodiments. The modeling results for an LED structure with no electron-blocking layer and no low refractive index material layer is also shown.

FIG. 11 illustrates modeling results for the fraction of light being guided in the active region of an LED that uses low refractive index material barriers and low refractive index material electron barrier layers, as a function of number of quantum wells, according to some embodiments. A curve based on an LED structure with no electron-blocking layer and no low refractive index material layer (solid line) is shown for reference. The dashed curve is based on a structure having a low refractive index material layer above the active region ($Al_{30}GaN$, 20 nm thick) and having quantum barriers made of a low refractive index material ($Al_{05}GaN$). As can be seen in FIG. 11, guiding is reduced in the LED that uses low refractive index material barriers and low refractive index material electron barrier layers as compared to the LED with no electron-blocking layer and no low refractive index material.

Several of the embodiments shown enable the use of structures with 10 quantum wells, with no or little GLAR.

As already mentioned, a superlattice layer (SL) is frequently grown in LEDs, overlying the active region in order to enhance performance. However the SL can have the detrimental effect of increasing GLAR by increasing the amount of high-index material close to the active region. A superlattice layer is typically formed of a succession of thin InGaN layers and GaN layers. In some cases a low-Indium content homogeneous InGaN layer is used instead of the SL. We also reference such a layer as an SL layer, as it serves a similar purpose and has similar effects regarding GLAR.

Figure 12:
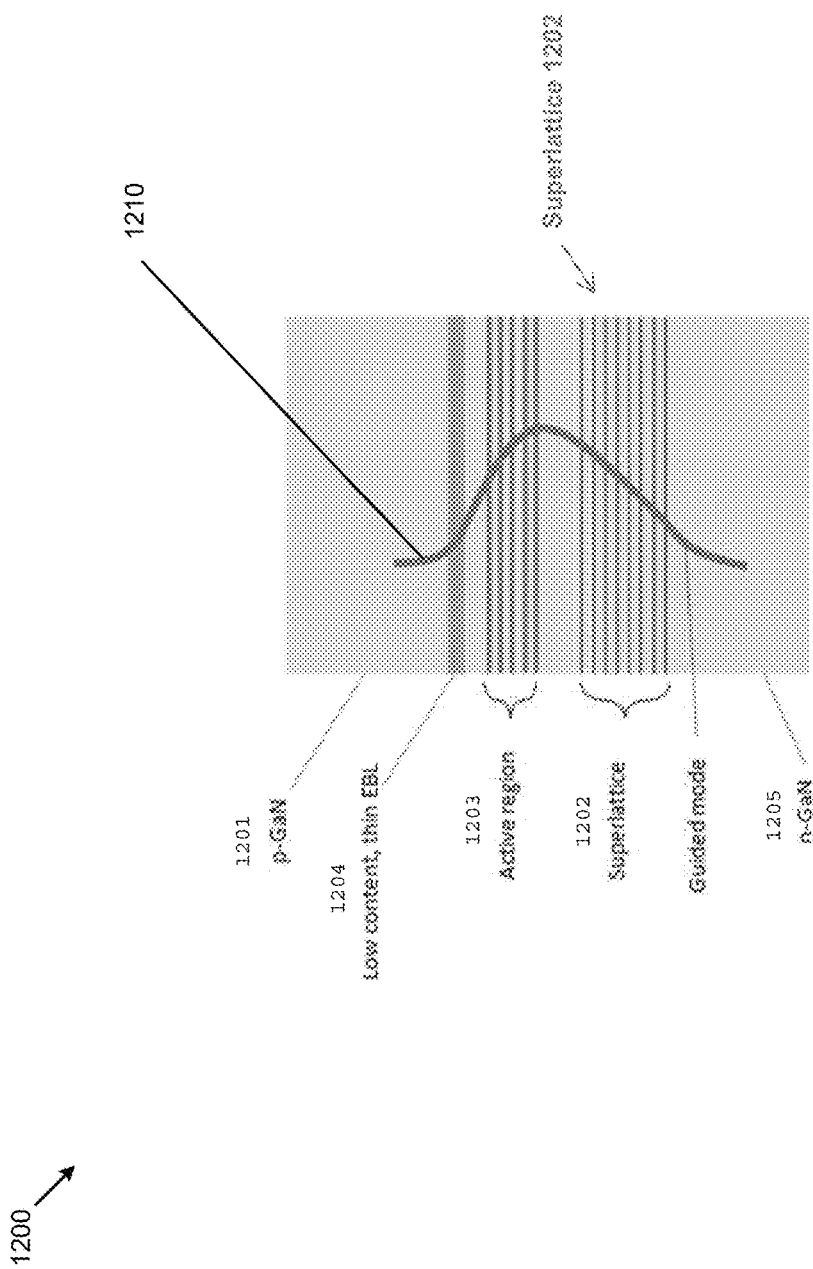
FIG. 12 is a simplified diagram illustrating a guided mode profile in an LED that includes a superlattice layer, according to some embodiments.

FIG. 12 is a simplified diagram illustrating a guided mode profile in an LED that includes a superlattice layer (SL), according to some embodiments. The LED shown in FIG. 12 includes a p-GaN layer 1201 overlying a thin electron blocking layer 1204, overlying an active region 1203, a superlattice 1202, and an n-GaN layer 1205. As shown in FIG. 12, the SL contributes to guiding of the mode 1210. Therefore, it may be desirable to include low refractive index material layers within or around the superlattice layer in order to mitigate the detrimental effects.

Figure 13:
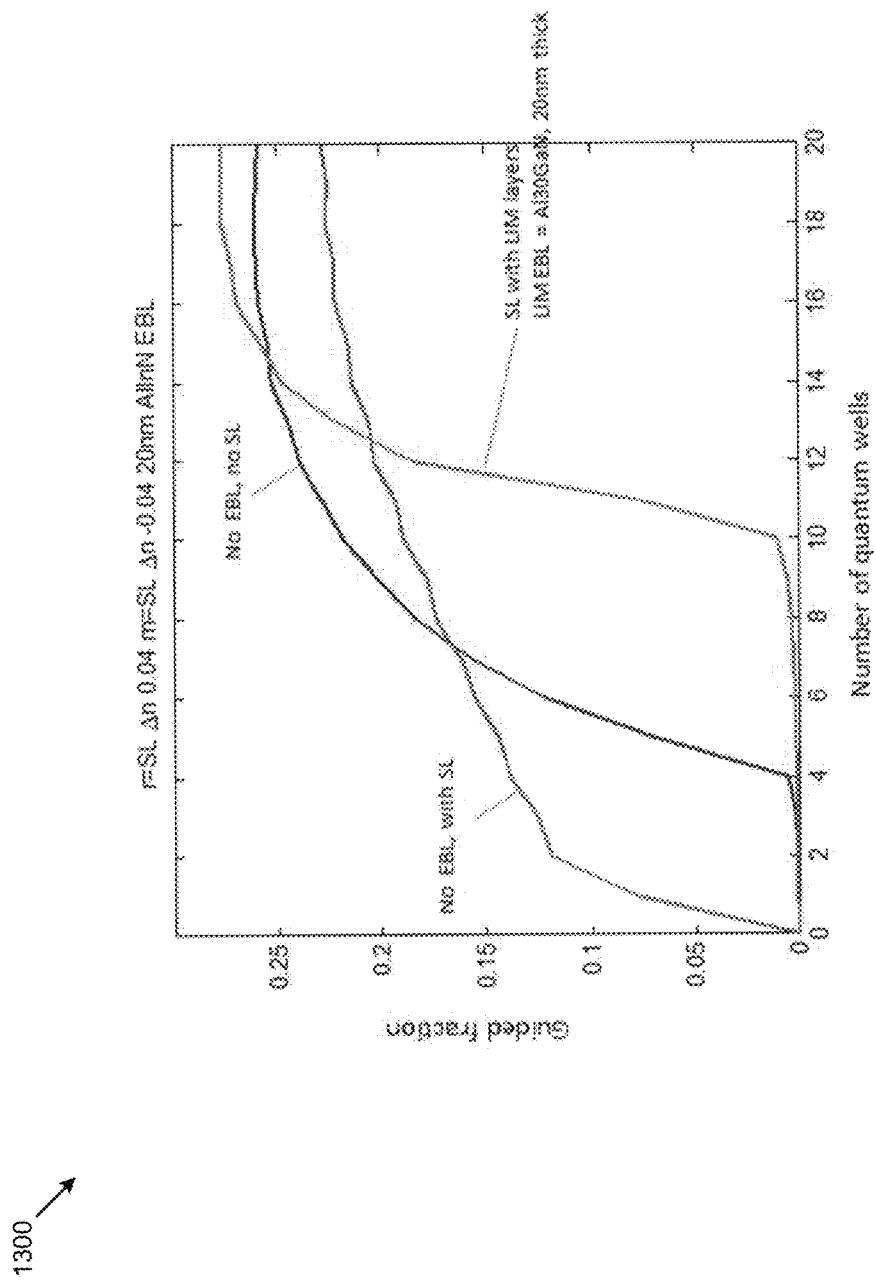
FIG. 13 shows modeling results for the fraction of light being guided in the active region of an LED that includes low refractive index layers disposed within a superlattice layer, as a function of the number of quantum wells, according to some embodiments. The modeling results for the fraction of light being guided in the active region of an LED without an electron barrier layer, and with and without a superlattice layer, are also shown.

FIG. 13 illustrates modeling results for the fraction of light being guided in the active region of an LED that includes low refractive index layers inserted in a superlattice layer, as a function of number of quantum wells, according to some embodiments. The modeling results for the fraction of light being guided in the active region of an LED without electron barrier layer, and with and without a superlattice layer, are also shown for comparison. As can be seen in FIG. 13, when a typical SL made of alternating thin layers of GaN and InGaN is added, GLAR is significantly increased when the number of quantum wells is less than about 5, as compared to an LED without superlattice layer. Also as can be seen in FIG. 13, when a LIM electron blocking layer (e.g., 20 nm thick, made of AlInN) is placed above the active region, and the SL is modified to include LIM layers, GLAR is reduced compared to an LED with a SL when the number of quantum wells is less than about 12. GLAR is also reduced compared to an LED without SL and without EBL if the number of quantum wells is less than about 15. In this illustrative example, the SL is made of alternating layers of AlGaN and InGaN, where the AlGaN layers act as LIM layers and serve to lower the average refractive index of the SL.

Accordingly, some embodiments reduce the guiding effect of the SL In one such embodiment, the GaN/InGaN SL is replaced with a low refractive index material/InGaN superlattice (such as an AlGaN/InGaN SL or an AlInN/InGaN SL) so that the average refractive index of the SL is lowered and guiding is reduced. In another embodiment, the GaN/InGaN SL is replaced with a GaN/LIM superlattice (such as GaN/AlInGaN SL) where the low refractive index material has the same beneficial effects as InGaN would in some embodiments of an SL, but its low refractive index mitigates guiding. In another such embodiment, the SL is clad between two low refractive index material layers.

The embodiments described above consider uses of a low refractive index material layer which is made of a homogeneous material, such as AlGaN, AlInN or AlInGaN. However, in some embodiments, the composition of the low refractive index material layer is not homogeneous. In some embodiments, the low refractive index material layer is a superlattice (such as a GaN/AlGaN superlattice or a GaN/AlInN superlattice). In other embodiments the low refractive index material layer has a varying composition across its growth direction, such as a layer of graded stoichiometry.

As has been mentioned previously, the low refractive index material layer may serve an additional purpose as an electron-blocking layer. In some embodiments, a low refractive index material layer may also be placed below the active region and serve as a hole-blocking layer.

As has been shown, it its possible, and sometimes desirable, to use several LIM layers placed around the active region. The multiple LIM layers may combine to reduce GLAR.

Accordingly, some embodiments are directed to achieving a specific cumulative thickness for the LIM layers, such that GLAR is substantially reduced. In some of these embodiments, a LIM layer of a given thickness is grown below the active region and another LIM layer is grown above the active region with a thickness such that the cumulative thickness of the LIM layers is greater than a target value.

As mentioned, some embodiments may combine the use of LIM layers to reduce GLAR, with other light-extracting features to increase extraction of the light which propagates across bulk of the LED. In some such embodiments, LIM layers are combined with surface roughening of LED. This can be obtained by growing epitaxial material that includes LIM layers, forming an LED chip with such material, and forming surface roughness on at least some of the facets of the LED. Similarly, other embodiments may combine the use of LIM layers with other light-extracting structures, such as a macroscopic shaping of the LED die.

Some embodiments may be implemented over others from the standpoint of epitaxial feasibility. Differences in lattice constant lead to strain and can make epitaxial growth challenging. For example, some AlInGaN compounds may have a large lattice constant difference with respect to the host material of the LED (such as GaN). In such cases, the maximum thickness of the corresponding low refractive index material layer is limited. Therefore, it may be desirable to limit the lattice mismatch. In some embodiments, the low refractive index material is lattice-matched or substantially lattice-matched to the host material of the LED. One example is $Al_{83}InN$, as the lattice of the low refractive index material $Al_{83}InN$ is close to being lattice-matched to GaN. In other embodiments, the low refractive index material is lattice-matched or substantially lattice-matched to the lattice constant of the quantum wells.

In Group III-nitride materials, polarization fields may be present in the heterostructure. It may be desirable to lower the intensity of these fields. In some embodiments, the low refractive index material is polarization-matched or substantially polarization-matched to GaN. In other embodiments, the low refractive index is polarization-matched or substantially polarization-matched to the quantum wells.

In some embodiments, the LED is a Group III-nitride LED having a surface orientation along a semipolar interface. In other embodiments, the LED is a Group III-nitride LED having a surface orientation along a non-polar interface.

Figure 14:
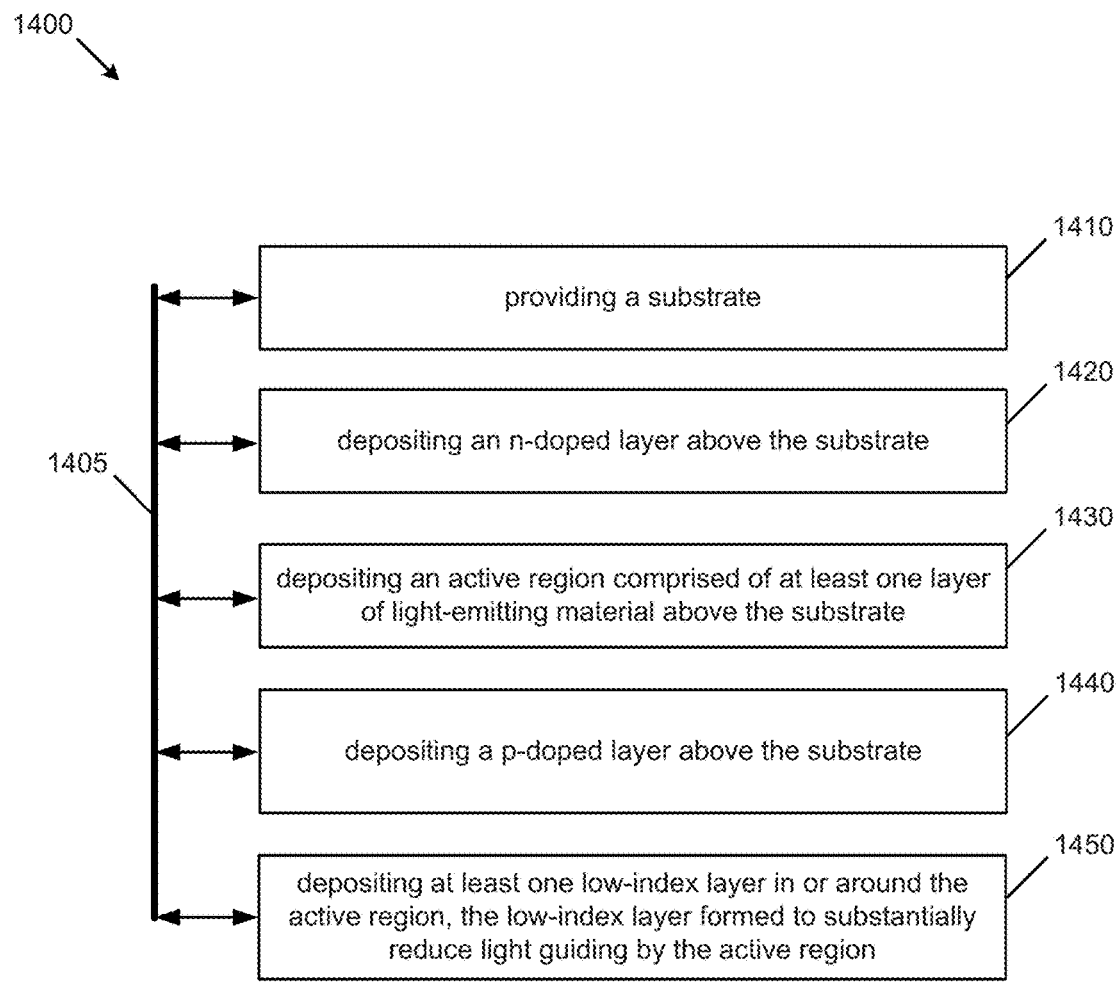
FIG. 14 is a simplified flowchart illustrating a method of making an LED, according to some embodiments.

FIG. 14 is a simplified flowchart illustrating a method of making an LED. Such a method and other methods are discussed infra. The method includes providing a substrate 1410, depositing an n-doped layer overlying the substrate 1420, depositing an active region comprising at least one layer of light-emitting material overlying the substrate 1430, depositing a p-doped layer overlying the substrate 1440, and depositing at least one low refractive index layer within at least one wavelength of the active region, the low refractive index layer configured to substantially reduce light guiding by the active region 1450.

Figure 15:
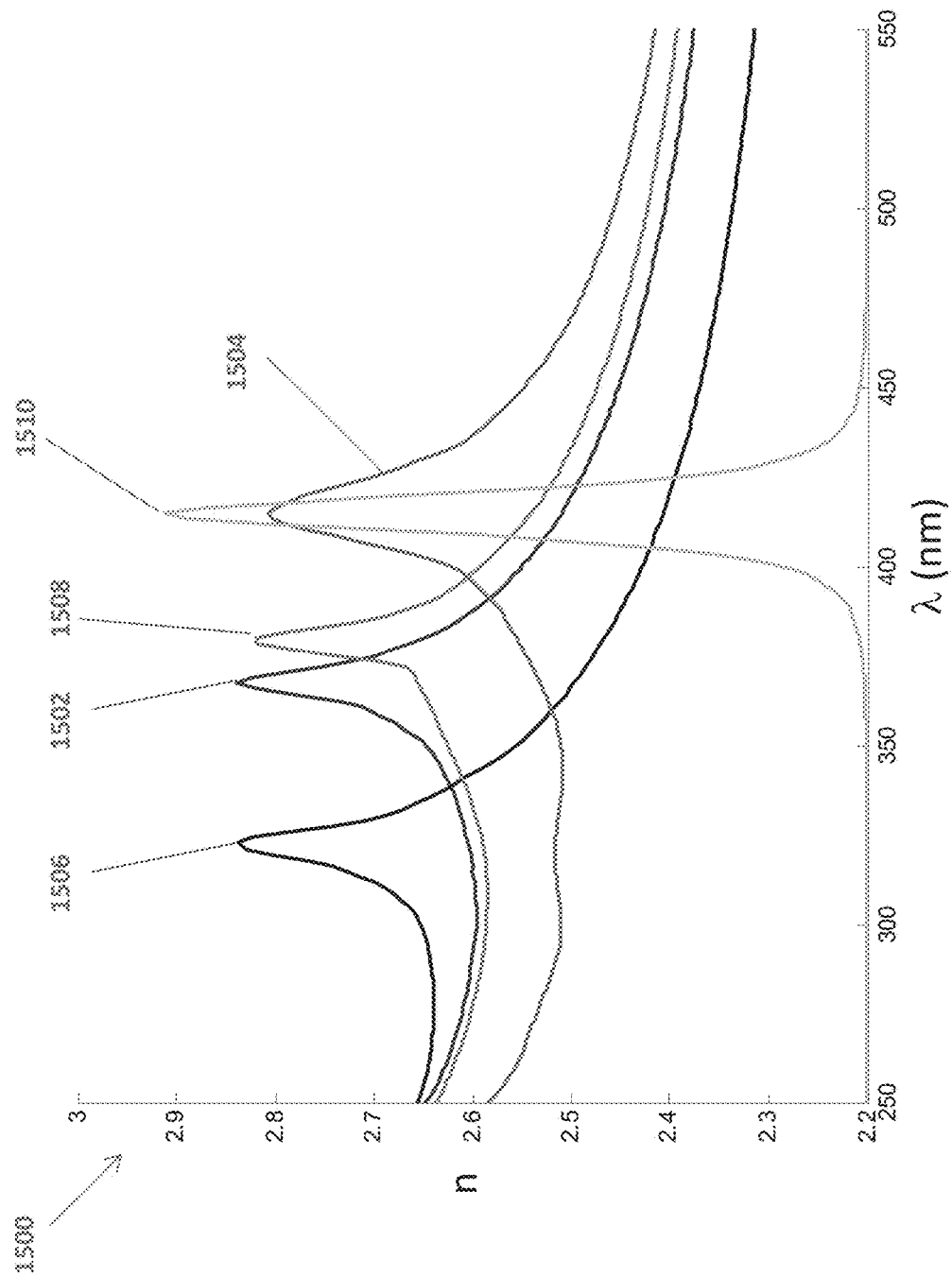
FIG. 15 shows experimental values of refractive index as a function of wavelength for Group III-nitride compounds (1502, 1504, 1506, and 1508), and the emission spectrum of a Group III-nitride LED (1510), according to some embodiments.

FIG. 15 shows experimental results of refractive index versus wavelength for a variety of III-nitride layers. To design specific embodiments, it may be desirable to employ modeling and use accurate values of the refractive index of respective layers. FIG. 15 illustrates experimental values of refractive index 1500 for various III-nitride layers, obtained by spectroscopic ellipsometry. The following layers are included in FIG. 15: GaN (1502), InGaN with a band gap of 410 nm (1504), AlGaN with a band gap of 320 nm (1506), InGaN with a band gap of 380 nm (1508). FIG. 15 also shows the emission spectrum 1510 of a Group III-nitride active region emitting around 400 nm. By using the full dispersion of refractive index shown on FIG. 15, embodiments can be accurately design to decrease or eliminate GLAR. Layers of various compositions can be grown and characterized to this effect.

Figure 16:
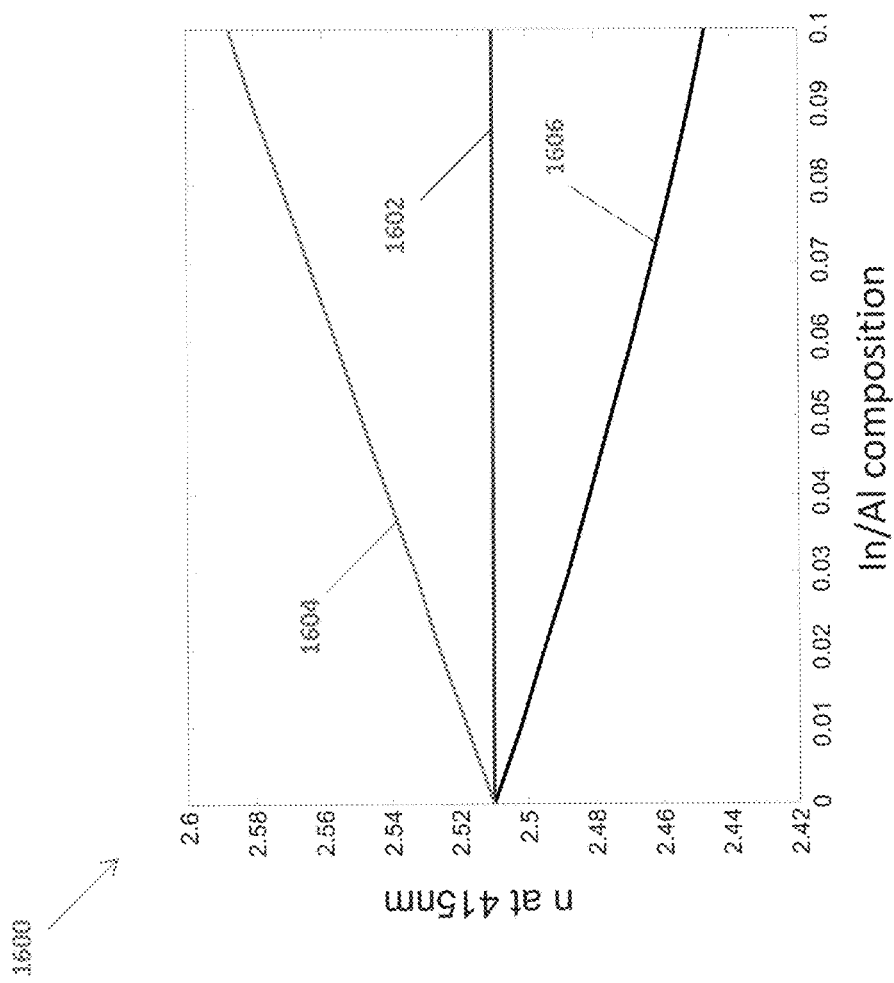
FIG. 16 shows the refractive index of Group III-nitride compounds as a function of the In or Al content, at a wavelength of 415 nm, according to some embodiments.

FIG. 16 shows values of refractive index 1600 versus compound composition, derived from experimental results. FIG. 16 shows the refractive index of various compounds at a wavelength of 415 nm. The index of GaN 1602 is indicated. Further, the index of InGaN 1604 and AlGaN 1606 are indicated as a function of In and Al composition, respectively. FIG. 16 can be employed to design successions of layers with a given average index. For instance, a superlattice made of AlGaN and InGaN layers of similar thickness where the Al and In composition are similar, has an average index which is similar to that of GaN. This is because the index increase in the InGaN layers is compensated by the index decrease in the AlGaN layers. Such a design may be desirable to decrease or suppress GLAR.

In some embodiments, it is desirable to grown so-called "dummy quantum wells" (DQW). DQW are quantum well layers with a higher band gap than the band gap of the active region. For instance, in the case of an InGaN LED, the DQW may be quantum wells in which the In content is lower than that of the active region. DQWs do not emit a substantial amount of light but can improve the performance of the LED for instance by improving the structural quality of the crystal or by integrating defects. DQW may be grown in the vicinity of the active region, for instance above or below the active region.

Figure 17:
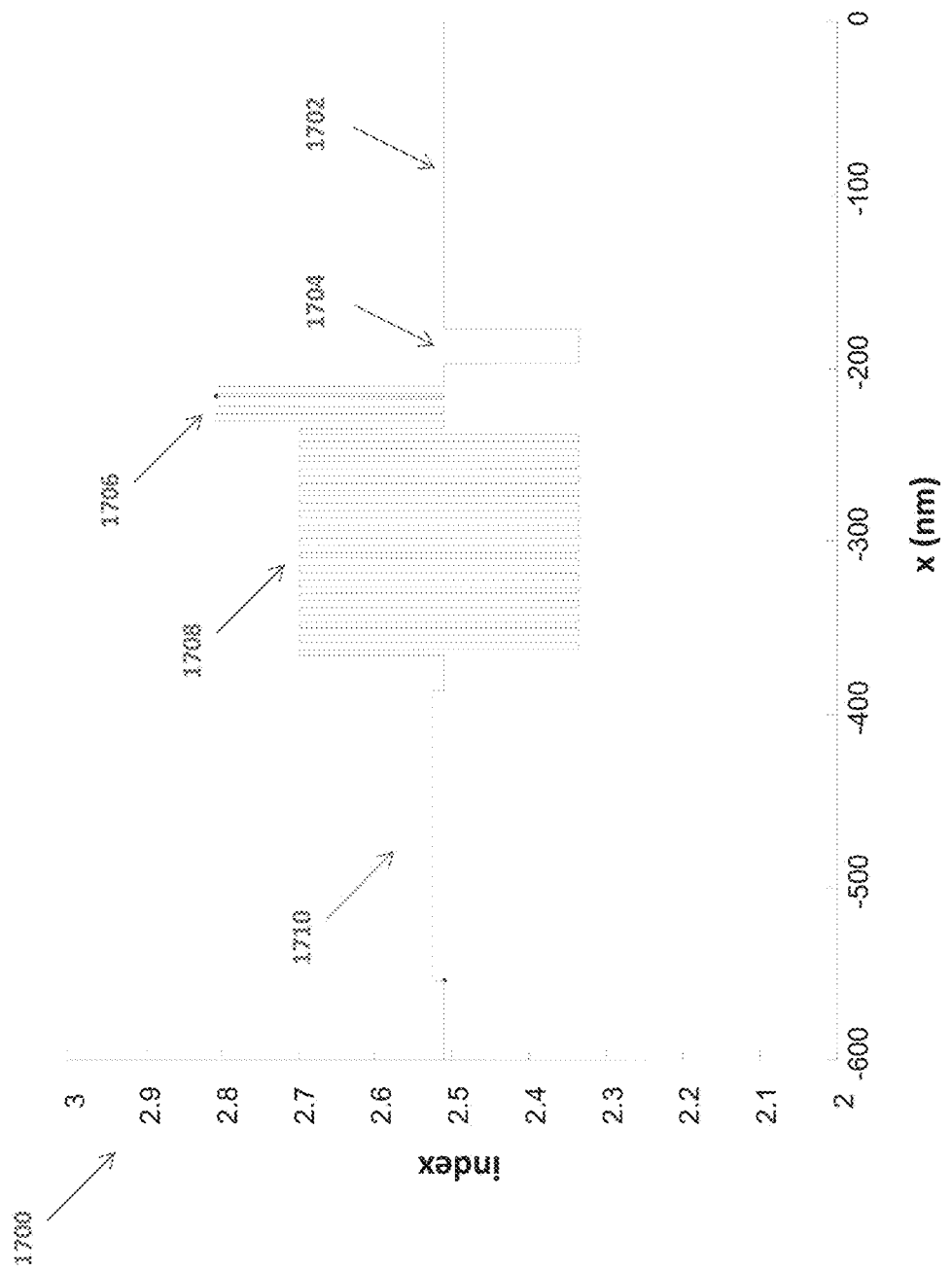
FIG. 17 shows a refractive index profile of a Group III-nitride LED with a quantum well active region, lower-content quantum wells and various low refractive index material layers, according to some embodiments.

FIG. 17 shows the index profile 1700 of a specific epitaxial structure which includes a DQW, as a function of position across the epitaxial stack. The position x=0 corresponds to the top of the stack. Various layers are present in the structure of FIG. 17. They include GaN 1702 (present both at the n- and p-sides of the stack); an EBL 1704; the active region 1706 (comprising quantum wells and barriers); a stack of DQW and their barriers 1708; and a superlattice 1710 (only the average index in the superlattice is shown, although it may comprise a succession of lower- and higher-index layers).

Structures similar to that of FIG. 17 may be used in some embodiments. In some embodiments, the superlattice may comprise InGaN and a LIM such as AlGaN layers. In some embodiments, the barriers of the DQW may comprise a LIM such as AlGaN. In some embodiments, the barriers in the active region may comprise a LIM such as AlGaN. In some embodiments, the EBL may comprise a LIM such as AlGaN. The thickness and composition of said LIM layers may be selected to reduce or suppress GLAR. Likewise, the number of DQW and emitting quantum wells may be selected to reduce or suppress GLAR.

Figure 18:
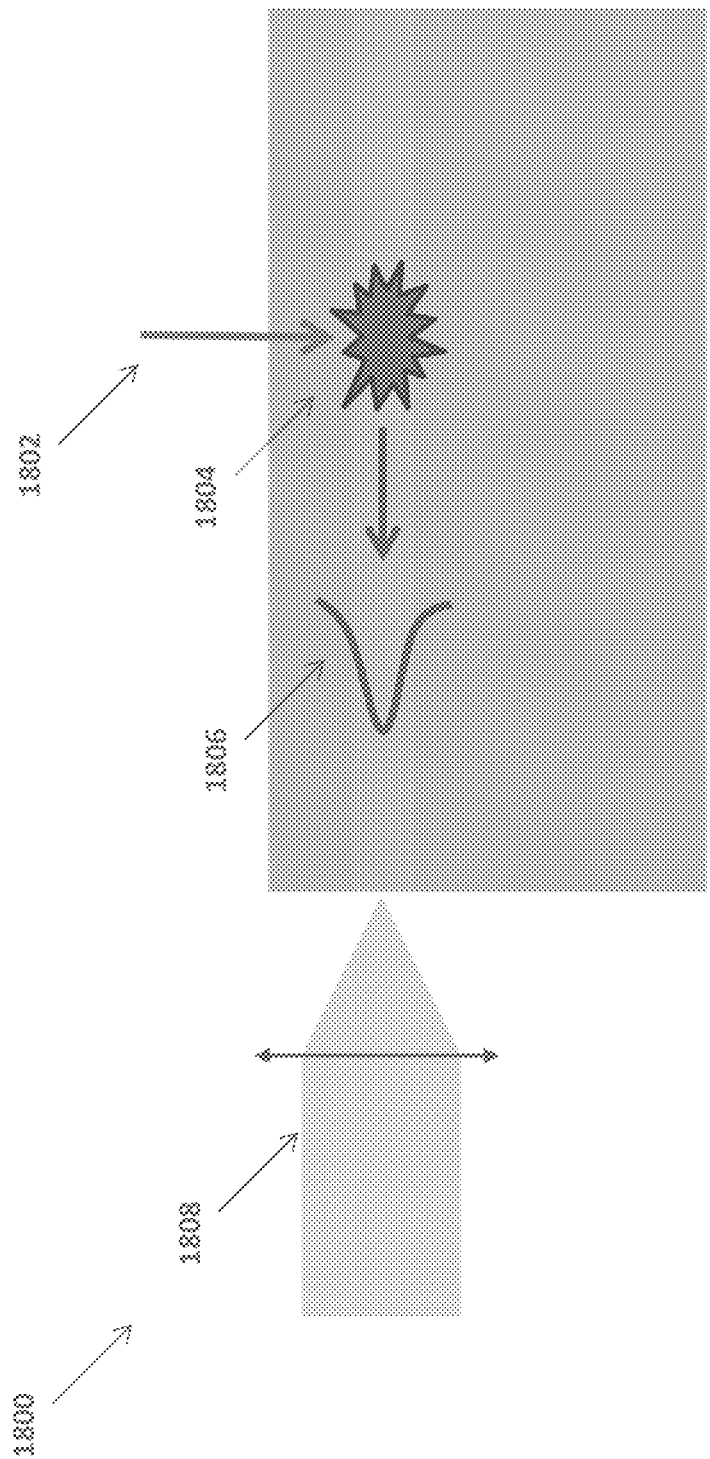
FIG. 18 illustrates an experimental setup used to measure the presence of guided light in an epitaxial structure.

FIG. 18 described an experimental setup 1800 used to detect the presence of GLAR. FIG. 18 shows how GLAR can be detected. Excitation by a laser 1802 causes photoluminescence 1804. Some of the luminescence is emitted into GLAR 1806 which can propagate to the edge of the sample and be collected by a detector 1808 such as a camera.

Figure 19:
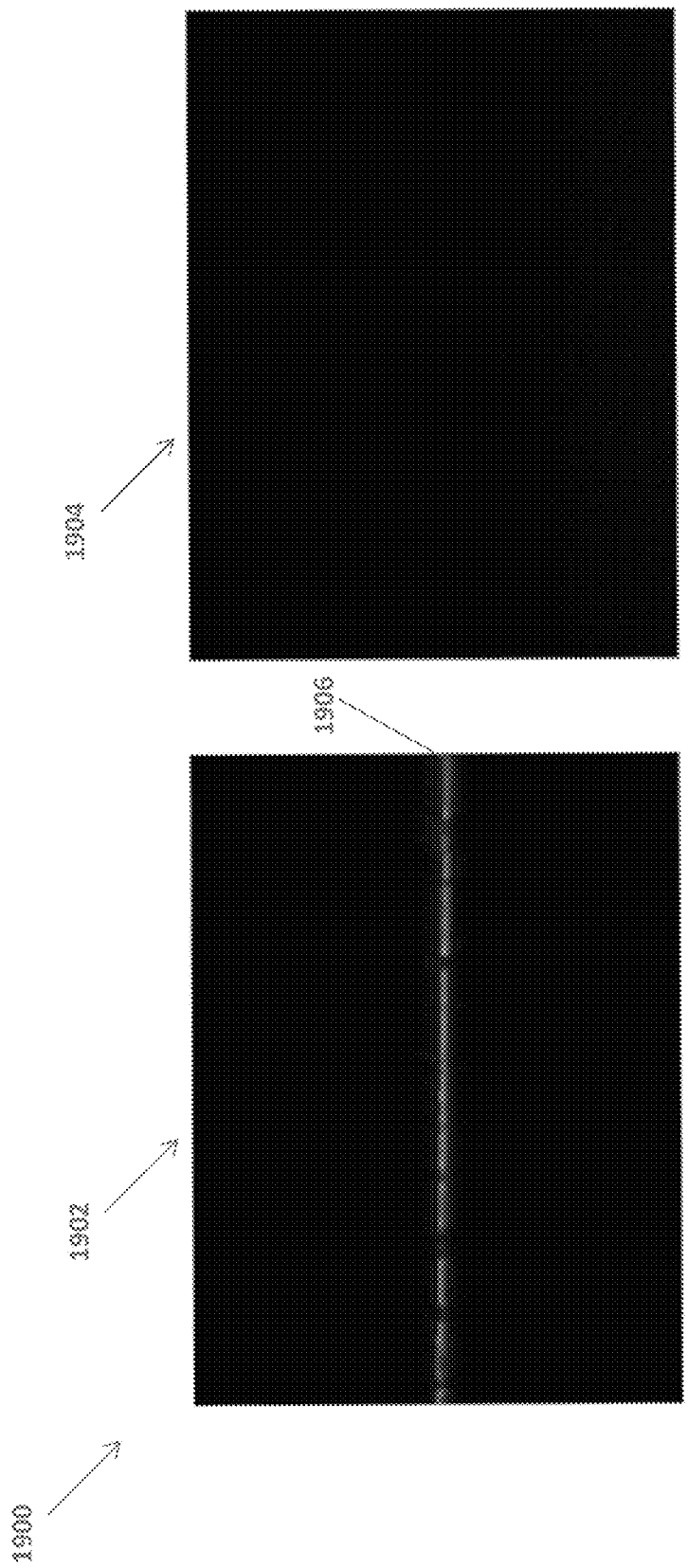
FIG. 19 shows images of guided light collected at LED facets by the experimental setup depicted in FIG. 18.

FIG. 19 shows camera images 1900 collected on a setup such as that of FIG. 18. FIG. 19 compares two samples. The left image 1902 corresponds to a sample grown using a standard epitaxial stack and the right image 1904 a sample grown using an epitaxial stack which suppresses GLAR. The latter stack is similar to that depicted in FIG. 17. A bright line 1906 is observed on the left image 1902: it corresponds to guided light reaching the sample edge. No signal is observed on the right image 1904 (collected under similar conditions). This manifests the absence of GLAR in epitaxial design (e.g., compare left image 1902 to right image 1904).

In some embodiments, a double-heterostructure (DH) active region may be employed rather than a quantum well stack. In some embodiments, the epitaxial structure may comprise a DH and one or several DQW grown below or above the DH. In some embodiments, the barriers of the DQW regions may comprise LIM layers.

Figure 20:
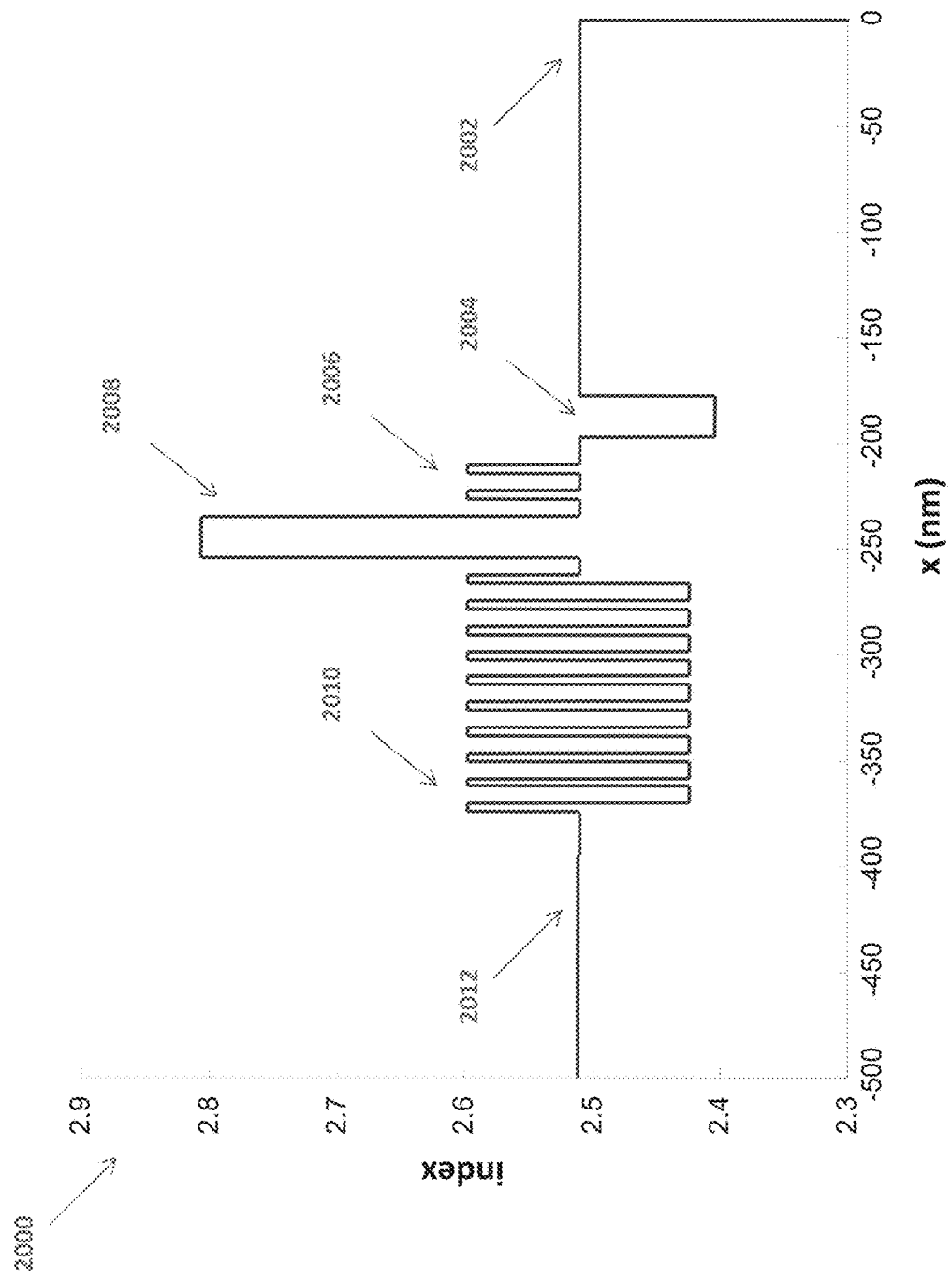
FIG. 20 shows a refractive index profile of a Group III-nitride LED with a double-heterostructure active region, lower-content quantum wells and various low refractive index material layers, according to some embodiments.

FIG. 20 shows the index profile 2000 of a specific epitaxial structure which includes DQW and a DH, as a function of position across the epitaxial stack. The position x=0 corresponds to the top of the stack. Various layers are present in the structure of FIG. 20. They include GaN 2002 (present both at the n- and p-sides of the stack); an EBL 2004; a stack of DQW and their barriers 2006; the DH active region 2008; a stack of DQW and their barriers 2010; and a superlattice 2012 (only the average index in the superlattice is shown, although it may comprise a succession of lower- and higher-index layers).

Structures similar to that of FIG. 20 may be used in some embodiments. In some embodiments, the superlattice may comprise InGaN and a LIM such as AlGaN layers. In some embodiments, the barriers of the DQW may comprise a LIM such as AlGaN. In some embodiments, the EBL may comprise a LIM such as AlGaN. The thickness and composition of said LIM layers may be selected to reduce or suppress GLAR. Likewise, the number of DQW on either side of the DH, and the thickness of the DH, may be selected to reduce or suppress GLAR.

In some embodiments, the LED is a Group III-nitride LED. In some embodiments, the composition of the SL layers is such that the average refractive index of the SL does not exceed that of GaN by more than 0.05. In some embodiments, the composition of the EBL is such that its refractive index is less than that of GaN minus 0.05. In some embodiments, the composition of the DQW and their barriers is such that the average refractive index of the DQW region does not exceed that of GaN by more than 0.05. All these values pertain to the wavelength of peak emission.

In an embodiment, the LED is a Group III-nitride LED whose epitaxial structure comprises the following layers:
a series of n-doped layers;
an AlGaN/InGaN superlattice whose average index does not exceed that of GaN by more than 0.05;
a GaN barrier;
a series of InGaN DQW with AlGaN barriers, such that the average index of this region does not exceed that of GaN by more than 0.05, and the number of DQWs is between zero and 20;
an active region composed of a DH or a series of quantum wells, such that the total amount of active material is less than 50 nm;
a series of InGaN DQW with GaN or AlGaN barriers where the number of DQW is between zero and five;
a GaN barrier;
an EBL whose refractive index is lower than that of GaN minus 0.05; and
a series of p-layers.

As a further way to reduce the GLAR fraction, some embodiments employ light-emitting layers in which the composition is inhomogeneous. For instance, in the case of a Group III-nitride LED, some embodiments employ InGaN light-emitting layers where the In composition is varied across at least one light-emitting layer, such as quantum wells or double heterostructures with a stepped or graded In profile. The variation in In composition may help reduce the average refractive index in the active region, and contribute to reducing or suppressing emission of GLAR.

The phenomenon of GLAR may be expected in a variety of LED structures. For instance, it may be expected in typical structures emitting light in the range 200-1,000 nm. As the emission wavelength of the LED increases, the index contrast between the host material (for instance GaN) and the emitting layer (for instance InGaN) usually increases, leading to a larger fraction of GLAR.

Figure 21:
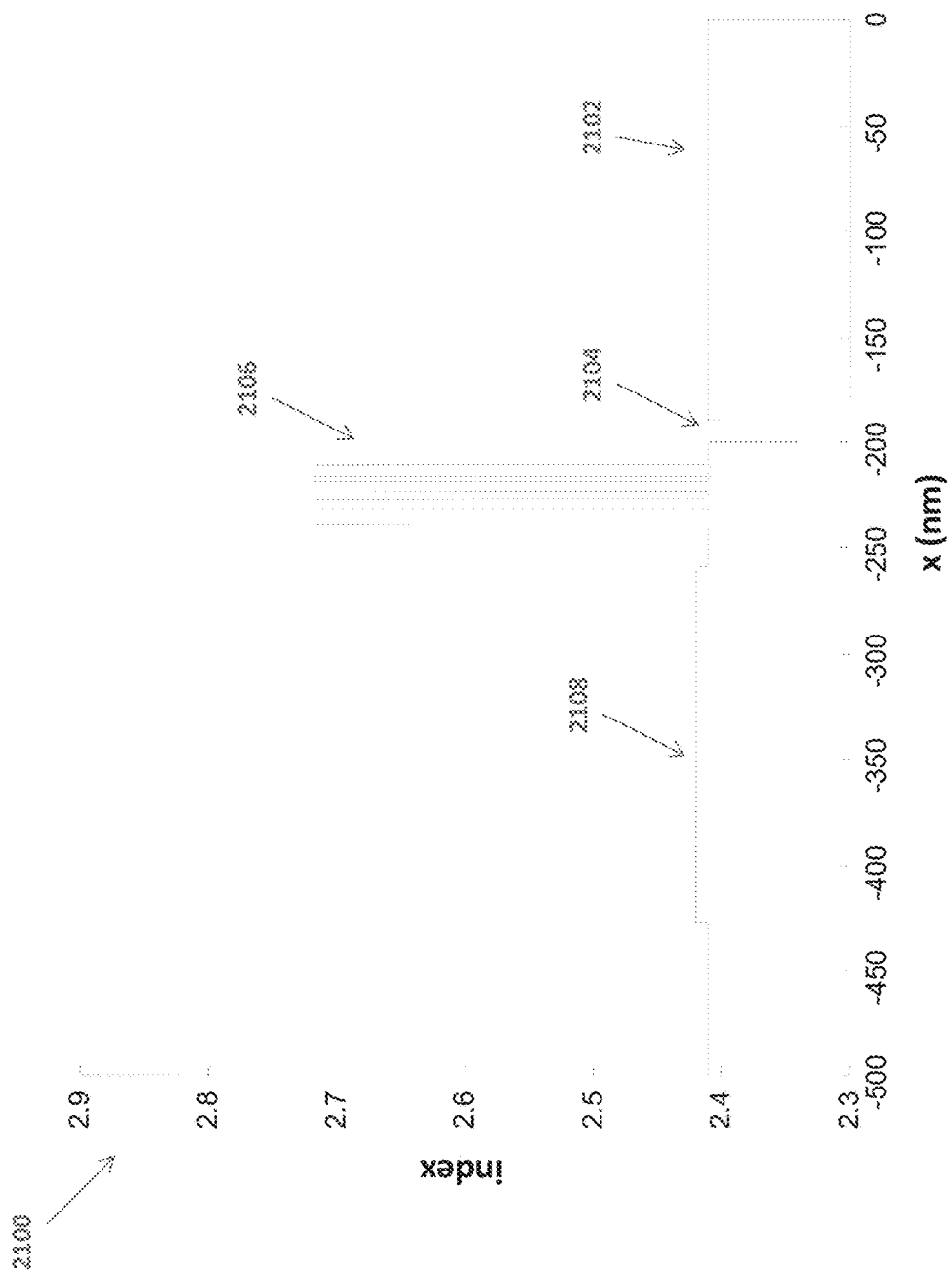
FIG. 21 shows the refractive index profile of a Group III-nitride LED with an active region comprising four quantum wells, a superlattice, and an electron blocking layer, for comparison with other embodiments.

FIG. 21 shows the index profile 2100 of a specific epitaxial structure as a function of position across the epitaxial stack. The position x=0 corresponds to the top of the stack. FIG. 21 comprises GaN layers 2102, an EBL 2104, four quantum wells 2106 and a superlattice 2108. The four quantum wells are 4.5 nm thick and their barriers are 3.5 nm thick. The EBL contains 10% Al and is 10 nm thick. The average In content in the superlattice is 4%. FIG. 21 is a simple LED structure which does not contain a large amount of In. Therefore, it can be considered as a conservative structure regarding the existence of GLAR. FIG. 21 is representative of some commercially available LED structures.

Figure 22:
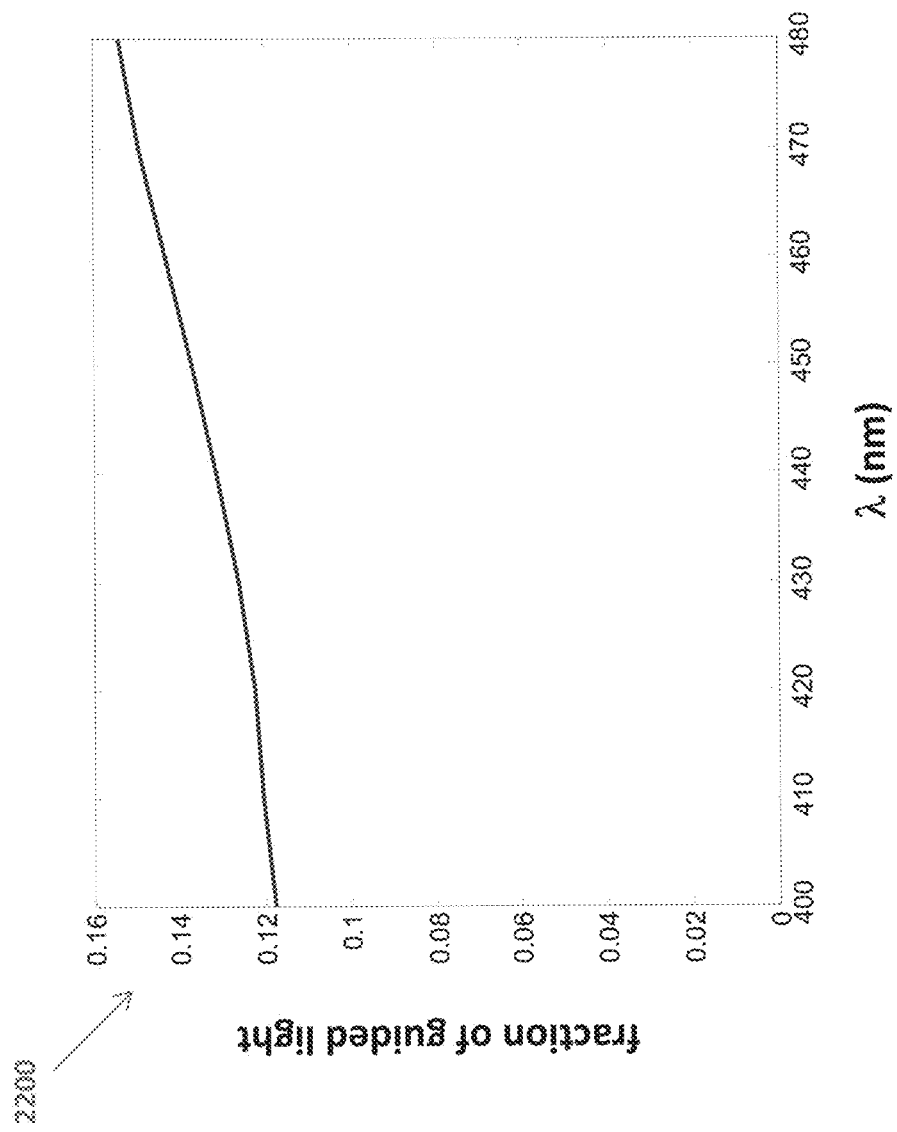
FIG. 22 shows the fraction of guided light as a function of LED emission wavelength, for the structure depicted in FIG. 21.

FIG. 22 shows the amount of guided light 2200 as a function of the LED's emission wavelength, for the structure of FIG. 21. FIG. 22 indicates the fraction of total emitted light which is emitted into GLAR, as a function of the emission wavelength of the LED. The fraction of GLAR increases for longer emission wavelength. This is due to the larger refractive index contrast between the quantum wells and GaN. FIG. 22 indicates that simple blue-emitting LED structures suffer from GLAR, which limits their performance.

Figure 23:
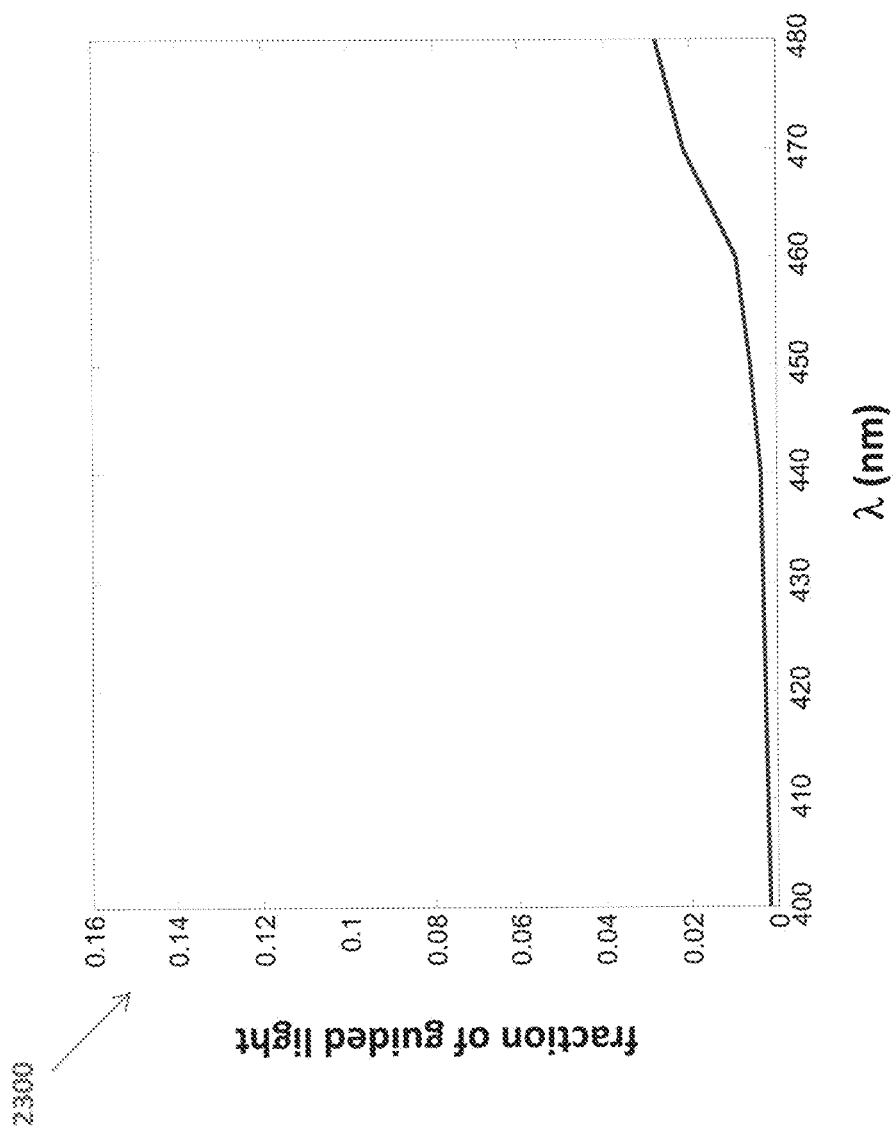
FIG. 23 shows the fraction of guided light as a function oft LED emission wavelength, for an embodiment of the invention which is similar to FIG. 21 but having a low refractive index material layer to reduce guided light emission.

FIG. 23 shows the amount of guided light 2200 as a function of the LED's emission wavelength, for a structure similar to that of FIGS. 21 and 22 but with LIM layers. The structure considered in FIG. 23 comprises an $Al_{05}GaN/In_{04}GaN$ superlattice, $Al_{15}GaN$ quantum well barriers and a 20-nm thick $Al_{20}GaN$ EBL. All these layers constitute LIM layers, as described for other embodiments. The fraction of guided light is substantially lower in FIG. 23 than in FIG. 22. For an LED emitting at 450 nm, the fraction of GLAR can be reduced tenfold.

Therefore, the techniques herein are relevant throughout a wide variety of wavelengths ranges and LED designs. It may improve performance substantially beyond commercially available LED epitaxial stacks. Moreover, the use of LIM to reduce the fraction of GLAR may have a significant impact on the performance of an LED. In certain embodiments, the use of LIM may affect the net extraction efficiency of the device by one or more percentage points, such as from 1% to 3%, from 1% to 5%, or from 1% to 10%.

Figure 24:
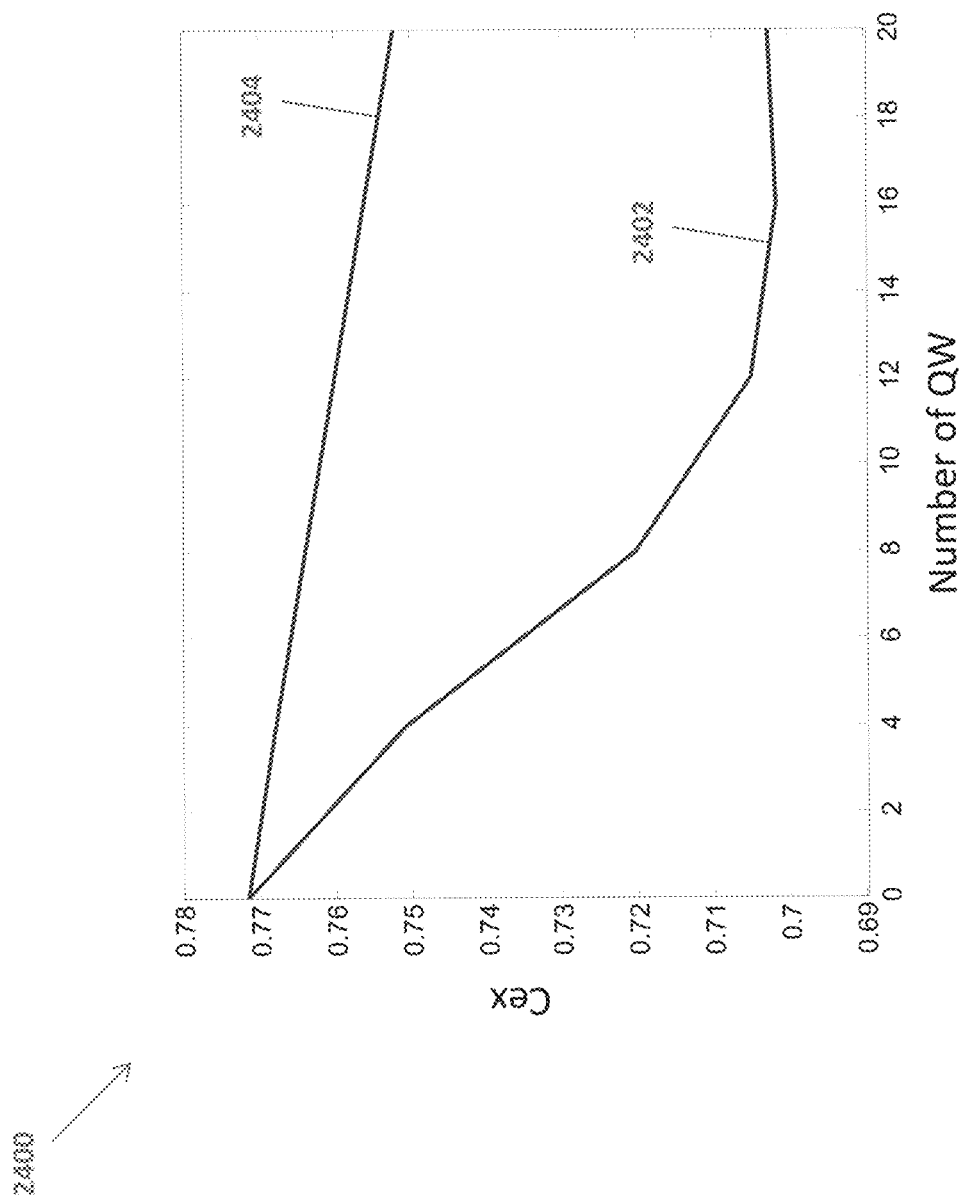
FIG. 24 shows the modeled extraction efficiency, as a function of the number of quantum wells, for a LED without a low refractive index layer (2402) and as compared to an LED having a low refractive index layer (2404).

FIG. 24 shows the modeled net extraction efficiency 2400 for LEDs as a function of the number of quantum wells in the structure. The LEDs under consideration are bulk GaN LEDs with surface roughness. In the absence of any guiding and active region re-absorption, their extraction efficiency is about 77%. In the case of a standard epitaxial structure where no care was taken to design LIM layers, the extraction efficiency 2402 is substantially affected by the number of quantum wells. Use of six quantum wells degrades extraction by about 4%. If well-designed LIM layers are used, the extraction efficiency 2404 is only weakly impacted by the number of quantum wells; the only impact in this case is the absorption of propagating light by the quantum wells. FIG. 24 shows that embodiments of the invention can improve an LED's performance by one or several percentage points.

A possible set of steps to obtain a device embodiments is as follows:
grow a set of conventional epitaxial layers (such as a GaN buffer and n-doped GaN) on an epitaxial substrate;
further grow a superlattice stack which includes LIM layers;
further grow an active region made of several quantum wells and barriers;
further grow a LIM layer which also serves as an EBL;
further grow a stack of p-doped GaN layer; and
process the resulting epitaxial material in order to form an LED chip.

Processing can include steps (e.g., within the aforementioned steps or before or after the aforementioned steps). For example, any known processing techniques might be used to produce light-extracting features, such as surface roughness, to the LED chip.

FIG. 14 is a simplified flowchart illustrating a method of making an LED, according to some embodiments. As shown, an LED device may be formed using several processing steps. The processing steps can be individually partitioned, and any aspect or materials of one process step can be provided to another process using path 1405. As shown, the method comprises:
providing a substrate (see processing step 1410);
depositing an n-doped layer above the substrate (see processing step 1420);

depositing an active region comprised of at least one layer of light-emitting material above the substrate (see processing step 1430);

depositing a p-doped layer above the substrate (see processing step 1440); and depositing at least one low refractive index layer in or around the active region, the low refractive index layer formed to substantially reduce light guiding by the active region (see processing step 1450).

It should be appreciated that the specific steps illustrated in FIG. 14 provide a particular method of making an LED according to an embodiment of the present invention. Other sequences of steps may also be performed according to alternative embodiments. For example, alternative embodiments of the present invention may perform the steps outlined above in a different order. Moreover, the individual steps illustrated in FIG. 14 may include multiple sub-steps that may be performed in various sequences as appropriate to the individual step. Furthermore, additional steps may be added or removed depending on the particular applications. One of ordinary skill in the art would recognize many variations, modifications, and alternatives.

The foregoing description of the exemplary embodiments has been presented only for the purposes of illustration and description and is not intended to be exhaustive or to limit the invention to the precise forms disclosed. Many modifications and variations are possible in light of the above teaching.

The embodiments were chosen and described in order to explain the principles of the invention and their practical application so as to enable others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. A light-emitting diode (LED) for emitting emitted light having a particular wavelength, said LED comprising:
   at least one n-doped layer;
   at least one p-doped layer;
   an active region comprising at least one layer of light-emitting material disposed between said at least one n-doped layer and said at least one p-doped layer, said active region having an average refractive index, calculated by averaging the refractive index across the thickness of said active region; and
   at least one low refractive index layer disposed within said particular wavelength of said active region, said at least one low refractive index layer having a refractive index below said average refractive index and a thickness sufficient to limit light being emitted into a guided mode of said active region to no more than 10% of said emitted light.

2. The light-emitting diode of claim 1, wherein said active region comprises a Group III-nitride material.

3. The light-emitting diode of claim 1, wherein said active region is characterized by a cumulative thickness of at least 100 nm.

4. The light-emitting diode of claim 1, wherein said at least one low refractive index material layer is disposed on one side of said active region, on both sides of said active region, within said active region, or a combination of any of the foregoing.

5. The light-emitting diode of claim 1, wherein,
   said active region comprises two or more quantum wells; and
   said at least one low refractive index layer comprises at least one barrier layer between said two or more quantum wells.

6. The light-emitting diode of claim 1, further comprising a substrate with a host refractive index, said refractive index of said at least one low refractive index is at least 0.05 less than said host refractive index.

7. The light-emitting diode of claim 6, wherein said active region and said at least one low refractive index material layer is characterized by an average refractive index from 0% to 5% higher than said refractive index of said host material.

8. The light-emitting diode of claim 1, further comprising:
   a superlattice disposed on one side of said active region or on both sides of said active region; and
   said at least one low refractive index material layer is disposed on one side of said superlattice, on both sides of said superlattice, within said superlattice, or a combination of any of the foregoing.

9. The light-emitting diode of claim 1, comprising a low-refractive index quantum well region is disposed on one side of said active region, wherein said low-refractive index quantum well region is configured to not emit a substantial amount of light.

10. The light-emitting diode of claim 9, comprising at least one low refractive index material layer surrounding said low-refractive index quantum well region.

11. A light-emitting diode (LED) comprising:
    at least one n-doped layer characterized by a host refractive index;
    at least one p-doped layer;
    an active region comprising of at least one layer of light-emitting material, disposed between said at least one n-doped layer and said at least one p-doped layer, characterized by an average refractive index calculated across the thickness of said active region, and characterized by an optical wavelength of emitted light;
    at least one low refractive index layer disposed within one optical wavelength of said active region, and configured to substantially reduce light guiding by said active region; and
    a superlattice underlying said active region, wherein said at least one low refractive index material layer is disposed within a distance from said superlattice that is less than one optical wavelength,
    wherein said average refractive index is from 0% to 5% higher than said host refractive index.

12. The light-emitting diode of claim 11, wherein less than 10% of total light emitted by said light-emitting material is guided by said active region.

13. The light-emitting diode of claim 11, wherein less than 2% of total light emitted by said light-emitting material is guided by said active region.

14. The light-emitting diode of claim 11, further comprising a III-nitride based material.

15. The light-emitting diode of claim 11, wherein said at least one low refractive index material layer is disposed on one side of said active region, on both sides of said active region, within said active region, or a combination of any of the foregoing.

16. The light-emitting diode of claim 11, wherein said active region comprises two or more quantum wells, wherein at least one barrier layer between said two or more quantum wells comprises a low refractive index material.

17. The light-emitting diode of claim 11, wherein said optical wavelength is within a range from about 200 nm to about 1000 nm.

18. The light-emitting diode of claim 11, wherein said active region comprises a plurality of InGaN quantum wells, and said at least one low refractive index layer comprises at least one AlGaN barrier positioned between two of said plurality of quantum wells.

19. The light-emitting diode of claim 11, wherein said superlattice comprises a plurality of InGaN superlattice layers, wherein said at least one low refractive index layer comprises at least one AlGaN layer located to said p-side of said active region and at least one AlGaN layer positioned between two of said plurality of InGaN superlattice layers.

20. The light-emitting diode of claim 19, wherein said superlattice comprises a succession of AlGaN layers and of either InGaN or AlInGaN layers.

* * * * *